United States Patent
Inaba

(10) Patent No.: US 12,106,982 B2
(45) Date of Patent: Oct. 1, 2024

(54) SUBSTRATE PROCESSING DEVICE

(71) Applicant: SCREEN Holdings Co., Ltd., Kyoto (JP)

(72) Inventor: Masaki Inaba, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 463 days.

(21) Appl. No.: 17/356,601

(22) Filed: Jun. 24, 2021

(65) Prior Publication Data

US 2022/0020616 A1    Jan. 20, 2022

(30) Foreign Application Priority Data

Jul. 15, 2020    (JP) .................................. 2020-121418

(51) Int. Cl.
*H01L 21/67* (2006.01)
*B65G 47/90* (2006.01)
*H01L 21/687* (2006.01)

(52) U.S. Cl.
CPC ........ *H01L 21/67207* (2013.01); *B65G 47/90* (2013.01); *H01L 21/6704* (2013.01); *H01L 21/67069* (2013.01); *H01L 21/67167* (2013.01); *H01L 21/67173* (2013.01); *H01L 21/67184* (2013.01); *H01L 21/68707* (2013.01)

(58) Field of Classification Search
None
See application file for complete search history.

(56) References Cited

U.S. PATENT DOCUMENTS

| | | | | |
|---|---|---|---|---|
| 6,503,365 B1* | 1/2003 | Kim | .................. | H01L 21/67167 414/217 |
| 8,322,299 B2* | 12/2012 | Yu | ..................... | H01L 21/76883 156/345.31 |
| 2005/0074983 A1* | 4/2005 | Shinriki | ................ | B08B 7/0035 438/785 |
| 2006/0033678 A1* | 2/2006 | Lubomirsky | ......... | H01L 21/288 345/32 |
| 2007/0119393 A1* | 5/2007 | Ashizawa | ......... | H01L 21/67196 123/25 M |
| 2014/0072397 A1 | 3/2014 | Mooring | | |

(Continued)

FOREIGN PATENT DOCUMENTS

| | | |
|---|---|---|
| JP | 2014-068009 A | 4/2014 |
| JP | 2017-183712 A | 10/2017 |
| JP | 2018-056203 A | 4/2018 |

OTHER PUBLICATIONS

Notice of Reasons for Refusal dated Mar. 5, 2024 in corresponding Japanese Patent Application No. 2020-121418 and a computer generated English translation obtained from the JPO.

*Primary Examiner* — Karla A Moore
(74) *Attorney, Agent, or Firm* — OSTROLENK FABER LLP

(57) ABSTRACT

A substrate processing device is a device continuously performing wet processing and dry processing. The substrate processing device includes a plurality of processing modules. Each of the plurality of processing modules includes a single wet processing unit performing wet processing on a substrate; a single dry processing unit performing dry processing on a substrate; and a single transfer unit located between the wet processing unit and the dry processing unit to transfer a substrate between the wet processing unit and the dry processing unit.

11 Claims, 9 Drawing Sheets

(56) References Cited

U.S. PATENT DOCUMENTS

2016/0163572 A1\* 6/2016 Mooring ........... H01L 21/67196
　　　　　　　　　　　　　　　　　　　　414/226.05
2017/0271180 A1\* 9/2017 Lill .................. H01L 21/67167
2018/0090352 A1　 3/2018 Sotoku et al.

\* cited by examiner

SUBSTRATE PROCESSING DEVICE

BACKGROUND OF THE INVENTION

Field of the Invention

The present application relates to a substrate processing device.

Description of the Background Art

Proposed conventionally is a wafer processing system in which an atmospheric pressure processing module performing wet processing on a substrate and a vacuum processing module performing dry processing on the substrate are mixedly included (for example, Japanese Patent Application Laid-Open No. 2017-183712). The wafer processing system in Japanese Patent Application Laid-Open No. 2017-183712 is a so-called a cluster tool type system.

In this wafer processing system, a carry-in air lock and a carry-out air lock used for transporting the wafer from and to outside are connected to a vacuum transportation module. Pressure in the vacuum transportation module is extremely small, and a degree of vacuum therein is high. A vacuum transportation robot is provided in the vacuum transportation module, and the vacuum transportation robot takes the wafer out of the carry-in air lock, and gives the wafer to the carry-out air lock.

A plurality of vacuum processing modules and a plurality of atmospheric pressure processing modules are disposed around the vacuum transportation module. Each vacuum processing module is directly connected to the vacuum transportation module. The vacuum transportation robot carries the wafer in each vacuum processing module, and carries the wafer out of each vacuum processing module.

In the meanwhile, each atmospheric pressure processing module is connected to the vacuum transportation module via the atmospheric pressure transportation module housing the atmospheric pressure transportation robot and the air lock in series. The vacuum transportation robot transports the wafer to the atmospheric pressure transportation robot once via the air lock, and the atmospheric pressure transportation robot carries the wafer in each atmospheric processing module. The atmospheric transportation robot carries the wafer out of each atmospheric pressure processing module, and transports the wafer to the vacuum transportation module via the air lock.

In a technique in Japanese Patent Application Laid-Open No. 2017-183712, the wafer necessarily goes through the vacuum transportation module both in the transportation to the vacuum processing module performing the dry processing and in the transportation to the atmospheric processing module performing the wet processing. Thus, in a period of time in which the wafer is transported from a certain vacuum processing module to a certain atmospheric pressure processing module, the transportation of the wafer between the other vacuum processing module and the other atmospheric pressure processing module is limited. Thus, it is difficult to make a transition of the processing between the wet processing and the dry processing immediately. That is to say, in the technique in Japanese Patent Application Laid-Open No. 2017-183712, it is difficult to perform the wet processing immediately after the dry processing and perform the dry processing immediately after the wet processing. Accordingly, throughput of the substrate processing is low.

In the technique in Japanese Patent Application Laid-Open No. 2017-183712, the wafer is transported via the air lock. The air lock is provided to perform the transportation between modules each having different pressure. The air lock performs processing of reducing pressure in the air lock and processing of bringing the pressure back to the atmospheric pressure in the transportation of the wafer. Also in this point, it is difficult to make a transition of the processing between the wet processing and the dry processing immediately. That is to say, throughput of the substrate processing is low.

The pressure in the air lock needs to be reduced to the same degree as the pressure in the vacuum module, thus a time required for adjusting the pressure increases as the pressure in the vacuum module gets small. Examples of the dry processing performed in the vacuum processing module include dry etching using plasma or an ion beam, ashing, or film formation processing as typified by chemical vapor deposition (CVD). In these types of dry processing, in order to reduce impurity such as moisture, oxygen, and carbon dioxide in the air, the pressure is reduced to $10^{-6}$ Torr or less once as preprocessing. In this case, it is sufficient that the pressure is reduced to $10^{-6}$ Torr or less also in the air lock. However, as a degree of vacuum gets high in this manner, a time required for reducing the pressure in the air lock increases, and a time for bringing the pressure back to the atmospheric pressure also increases. Accordingly, throughput significantly decreases.

SUMMARY

In one aspect of the present disclosure, a substrate processing device is a substrate processing device continuously performing wet processing and dry processing on a substrate, including a plurality of processing modules, wherein each of the plurality of processing modules includes: a single wet processing unit performing wet processing on a substrate; a single dry processing unit performing dry processing on a substrate; and a single transfer unit located between the wet processing unit and the dry processing unit to transfer a substrate between the wet processing unit and the dry processing unit.

According to this aspect, the transfer unit is provided to correspond to the wet processing unit and the dry processing unit. Thus, for example, the transfer unit can transfer the substrate to the dry processing unit immediately after finishing the wet processing. Thus, the dry processing can be started immediately after the wet processing. The transfer unit can transfer the substrate to the wet processing unit immediately after finishing the dry processing. Thus, the wet processing can be started immediately after the dry processing. Accordingly, throughput can be increased.

It is preferable that the dry processing includes at least one of oxidation processing or resist removal processing using ozone gas, gas phase etching processing using etching gas containing fluorine, and hydrogen reduction processing using hydrogen gas, and the wet processing includes wash processing of washing a substrate.

According to this aspect, the substrate can be washed immediately after the dry processing.

It is preferable that each of the plurality of processing modules includes: a chassis housing the wet processing unit, the dry processing unit, and the transfer unit; a first shutter for transferring a substrate provided in a first inner wall between a wet processing space housing the wet processing unit and a transfer space housing the transfer unit in the chassis; and a second shutter for transferring a substrate provided in a second inner wall between the transfer space and a dry processing space housing the dry processing unit in the chassis.

According to this aspect, the transfer unit can receive and give the substrate from and to the wet processing unit when the first shutter is opened. The transfer unit can receive and give the substrate from and to the dry processing unit when the second shutter is opened.

It is preferable that the wet processing unit includes a wet suction tube provided in the wet processing space to suck gas in the wet processing space, and a suction inlet of the wet suction tube is located near a first opening formed in the first inner wall when the first shutter is opened.

According to this aspect, the flowing of the atmosphere gas from the wet processing space to the transfer space can be suppressed. Thus, the flowing of the atmosphere gas in the wet processing space to the dry processing space through the transfer space can also be suppressed. Accordingly, a defect caused by the atmosphere gas in the wet processing space adhering to various configurations in the transfer space and the dry processing space can be suppressed.

A width of the suction inlet of the wet suction tube is preferably larger than a width of the first opening.

According to this aspect, the flowing of the atmosphere gas from the wet processing space to the transfer space can be further suppressed.

It is preferable that the dry processing unit includes a dry suction tube provided in the dry processing space to suck gas in the dry processing space, and a suction inlet of the dry suction tube is located near a second opening formed in the second inner wall when the second shutter is opened.

According to this aspect, the flowing of the gas from the dry processing space to the transfer space can be suppressed. Thus, the flowing of the atmosphere gas in the dry processing space to the wet processing space through the transfer space can also be suppressed. Accordingly, a defect caused by the atmosphere gas in the dry processing space adhering to various configurations in the transfer space and the wet processing space can be suppressed.

A width of the suction inlet of the dry suction tube is preferably larger than a width of the second opening.

According to this aspect, the flowing of the atmosphere gas from the dry processing space to the transfer space can be further suppressed.

Pressure in the transfer space is preferably larger than both pressure in the wet processing space and pressure in the dry processing space.

According to this aspect, the flowing of the atmosphere gas from the wet processing space to the transfer space and from the dry processing space to the transfer space can be suppressed.

Preferably, each of the plurality of processing modules further includes a gas supply part supplying inactive gas to the transfer space.

According to this aspect, a pressure difference between the pressure in the transfer space and the pressure in the wet processing space can be adjusted to have a larger value, and a pressure difference between the pressure in the transfer space and the pressure in the dry processing space can be adjusted to have a larger value.

Preferably, each of the plurality of processing modules further includes a transfer suction tube sucking gas in the transfer space.

According to this aspect, the atmosphere gas in the transfer space can be exhausted outside. Thus, particles occurring in the transfer space caused by activating the transfer unit can be exhausted outside.

The substrate is preferably transferred between the dry processing unit and the wet processing unit without passing through a decompression space.

According to this aspect, throughput can be increased.

It is preferable that the substrate processing device further includes a transportation mechanism transporting a substrate to the plurality of processing modules, wherein the transportation mechanism transports a substrate to at least one of the wet processing unit and the dry processing unit in each of the plurality of processing modules.

According to this aspect, the substrate can be transported to the processing module.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
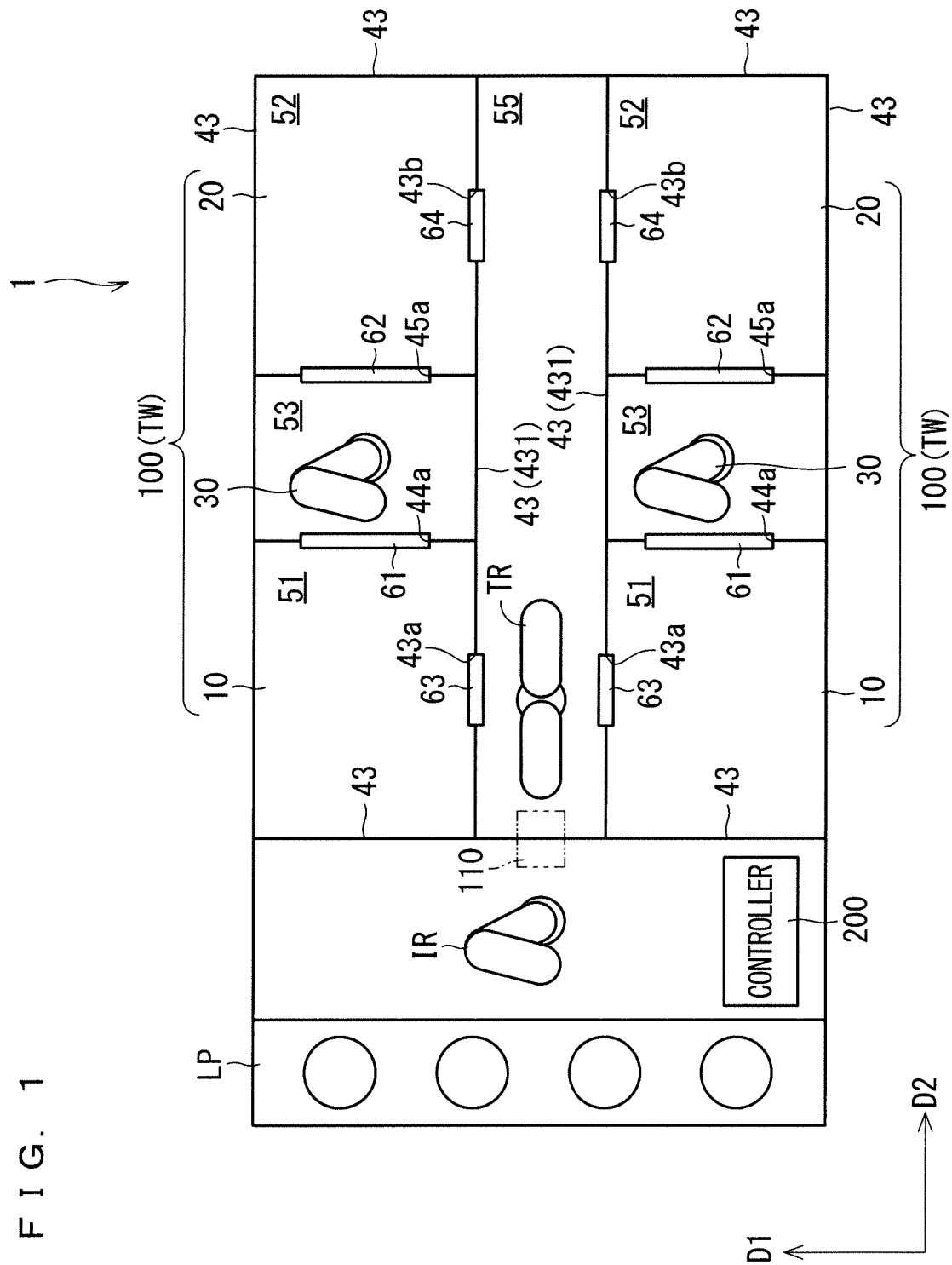
FIG. 1 is a plan view schematically illustrating an example of a configuration of a substrate processing device.

Embodiments are described hereinafter with reference to the appended drawings. The drawings are schematically illustrated, thus a configuration is appropriately omitted or simplified for convenience of explanation. A mutual relationship of sizes and positions of constituent elements illustrated in the drawings is not necessarily illustrated accurately, but may be appropriately changed.

In the description hereinafter, the same reference numerals will be assigned to the similar constituent elements in the drawings, and the constituent elements having the same reference numeral have the same name and function. Accordingly, the detailed description on them may be omitted to avoid a repetition in some cases.

In the following description, even when ordinal numbers such as "first" or "second" are stated, the terms are used to facilitate understanding of embodiments for convenience, and therefore, the usage of the ordinal numbers does not limit the indication of the ordinal numbers to ordering.

Unless otherwise noted, the expressions indicating relative or absolute positional relationships (e.g., "in one direction", "along one direction", "parallel", "orthogonal", "central", "concentric", and "coaxial") include those exactly indicating the positional relationships and those where an angle or a distance is relatively changed within tolerance or to the extent that similar functions can be obtained. Unless otherwise noted, the expressions indicating equality (e.g., "same", "equal", "uniform", and "homogeneous") include those indicating quantitatively exact equality and those in the presence of a difference within tolerance or to the extent that similar functions can be obtained. Unless otherwise noted, the expressions indicating shapes (e.g., "rectangular" or "cylindrical") include those indicating geometrically exact shapes and those indicating, for example, roughness or a chamfer to the extent that similar advantages can be obtained. An expression "comprising", "including", or "having" a certain constituent element is not an exclusive expression for excluding the presence of the other constituent elements. An expression "at least one of A, B, and C" involves only A, only B, only C, arbitrary two of A, B, and C, and all of A, B, and C.

<Schematic Configuration of Substrate Processing Device>

FIG. 1 is a plan view schematically illustrating an example of a configuration of a substrate processing device 1. The substrate processing device 1 is a single processing device performing processing on a substrate W one by one. For example, the substrate W is a substrate for a semiconductor device, and has a circular plate-like shape. This substrate processing device 1 can continuously perform wet processing and dry processing on the substrate W.

In an example in FIG. 1, the substrate processing device 1 includes a load port LP as an example of a carry-in part, an indexer robot IR, a transportation robot TR as an example of a transportation mechanism, a plurality of processing modules 100, and a controller 200.

The load port LP is an interface part for receiving and giving the substrate W from and to an outer side of the substrate processing device 1. A carrier housing the plurality of substrates W are carried in the load port LP. Adoptable as the carrier is a front opening unified pod (FOUP) and a standard mechanical interface (SMIF) pod housing the substrate W in an enclosed space or an open cassette (OC) exposing the substrate W to the air. The load port LP holds the plurality of carriers in a state of being arranged along a horizontal arrangement direction D1, for example.

The indexer robot IR is provided in a position adjacent to the load port LP in a horizontal direction D2 perpendicular to the arrangement direction D1. The indexer robot IR is provided to be movable along the arrangement direction D1 by a movement mechanism such as a ball screw mechanism, for example. The indexer robot IR can stop at a position facing each carrier held by the load port LP. In the example in FIG. 1, the indexer robot IR stops at a center position facing a center part of the load port LP in the arrangement direction D1.

The indexer robot IR includes a hand, for example, and can move the hand in a horizontal direction by a drive mechanism such as an arm mechanism, for example, and can also move the hand in a vertical direction by an up-down mechanism such as a ball screw mechanism, for example. The indexer robot IR can move to a position facing a carrier to be taken out, and can move the hand in the horizontal direction and the vertical direction to take the substrate W out of the carrier and house the substrate W in the carrier.

The indexer robot IR can change a direction of the hand by a rotation mechanism such as a motor. The indexer robot IR can make the hand face the transportation robot TR by the rotation mechanism. The indexer robot IR moves the hand in the horizontal direction and the vertical direction in this state to be able to receive and give the substrate W from and to the transportation robot TR. The transportation robot TR is provided on an opposite side of the indexer robot IR from the load port LP. In the example in FIG. 1, the transportation robot TR is disposed side-by-side with the indexer robot IR stopping at the center position in the direction D2.

The indexer robot IR needs not necessarily receive and give the substrate W from and to the transportation robot TR directly, but may receive and give the substrate W via a substrate passing part 110. The substrate passing part 110 is provided between the indexer robot IR stopping at the center position and the transportation robot TR. That is to say, the indexer robot IR stopping at the center position, the substrate passing part 110, and the transportation robot TR are disposed side by side in this order in the direction D2. The substrate passing part 110 includes a member positioning or holding the substrate W. The indexer robot IR gives the substrate W to the member, and the transportation robot TR takes the substrate W out of the member. In a reverse manner, the transportation robot TR gives the substrate W to the member, and the indexer robot IR takes the substrate W out of the member.

The transportation robot TR transports the substrate W between each processing module 100 and the indexer robot IR (or the substrate passing part 110). A space housing the transportation robot TR is referred to as a transportation space 55 hereinafter.

The two processing modules 100 are illustrated in the example in FIG. 1. The two processing modules 100 are disposed with the transportation space 55 therebetween in the arrangement direction D1. That is to say, the two processing modules 100 are provided opposite each other with the transportation space 55 therebetween.

Each of the processing modules 100 includes a single wet processing unit 10, a single dry processing unit 20, and a single transfer unit 30 as an example of a transfer mechanism. In other words, the single wet processing unit 10, the single dry processing unit 20, and the single transfer unit 30 constitute the single processing module 100.

The wet processing unit 10 performs the wet processing on the substrate W. The wet processing indicates processing performed by supplying a processing solution to the substrate W. For example, the wet processing is wash processing using the processing solution. The processing solution includes at least one of SC1, SC2, hydrofluoric acid, sulfuric acid, ammonia water, a mixed solution of sulfuric acid and hydrogen peroxide solution, phosphoric acid, a wash solution of ozone water and a polymer wash solution, and a rinse solution of pure water and isopropyl alcohol, for example. SC1 is a mixed solution of ammonia and hydrogen peroxide solution. SC2 is a mixed solution of hydrochloric acid and hydrogen peroxide solution. The wet processing is performed in an atmosphere close to atmospheric pressure.

The dry processing unit 20 is provided in a position different from the wet processing unit 10 in a plan view, and performs the dry processing on the substrate W. The dry processing herein indicates processing performed by supplying processing gas to the substrate W. For example, the dry processing includes processing using ozone ($O_3$) gas as the processing gas, gas phase etching processing using etching gas as the processing gas, or reduction processing performed on an oxide film using hydrogen ($H_2$) gas. The processing using ozone gas includes oxidation processing or resist removal processing, for example. The gas phase etching processing is etching processing not using plasma, and includes etching processing using etching gas such as hydrogen fluoride (HF) gas, chlorine trifluoride ($ClF_3$) gas, ammonia ($NH_3$) gas, and iodine fluoride ($IF_7$) gas, for example. Alternatively, the gas phase processing may include etching processing using radical generated by emitting ultraviolet light to etching gas such as mixed gas of fluorine gas ($F_2$) and hydrogen gas or nitrogen trifluoride ($NF_3$). These types of dry processing are also performed in an atmosphere close to atmospheric pressure.

The transfer unit 30 is provided between the wet processing unit 10 and the dry processing unit 20 disposed in the same plane. The transfer unit 30 transfers the substrate W between the wet processing unit 10 and the dry processing unit 20 disposed in the same plane. That is to say, the transfer unit 30 can transfer the substrate W from the wet processing unit 10 to the dry processing unit 20, and can also transfer the substrate W from the dry processing unit 20 to the wet processing unit 10. In the example in FIG. 1, the wet processing unit 10, the transfer unit 30, and the dry processing unit 20 are disposed side by side in this order along the direction D2. The transportation of the substrate W in the processing module 100 is referred to as "the transfer" herein, however, "the transfer" needs not be distinguished from "the transportation" in a technical meaning.

A configuration of the transfer unit 30 is not particularly limited, but includes a hand and a hand drive mechanism moving the hand, for example. The hand drive mechanism includes a horizontal drive mechanism horizontally moving the hand and a vertical drive mechanism vertically moving the hand. The horizontal drive mechanism includes a mechanism such as an arm mechanism, a ball screw mechanism, and a cylinder mechanism, for example. The vertical drive mechanism includes a mechanism such as a ball screw mechanism and a cylinder mechanism, for example. The transfer unit 30 moves the hand, thereby receiving and giving the substrate W from and to each of the wet processing unit 10 and the dry processing unit 20.

As exemplified in FIG. 1, the arrangement order of the wet processing unit 10, the transfer unit 30, and the dry processing unit 20 may be the same in the plurality of processing modules 100. In the example in FIG. 1, the wet processing unit 10 belonging to one processing module 100 faces the wet processing unit 10 belonging to the other processing module 100 with the transportation space 55 therebetween in the arrangement direction D1. In the similar manner, the both transfer units 30 face each other with the transportation space 55 therebetween in the arrangement direction D1, and the both dry processing unit 20 face each other with the transportation space 55 therebetween in the arrangement direction D1.

The transportation robot TR is provided in the transportation space 55. The transportation robot TR can move along the direction D2 by a movement mechanism such as a ball screw mechanism, for example. The transportation robot TR can stop at a position facing each of the wet processing unit 10 and the dry processing unit 20.

A configuration of the transportation robot TR is not particularly limited, but includes a hand and a hand drive mechanism moving the hand, for example. The hand drive mechanism includes a horizontal drive mechanism horizontally moving the hand and a vertical drive mechanism vertically moving the hand. The horizontal drive mechanism includes a mechanism such as an arm mechanism, a ball screw mechanism, and a cylinder mechanism, for example. The vertical drive mechanism includes a mechanism such as a ball screw mechanism and a cylinder mechanism, for example. The transportation robot TR receives and gives the substrate W from and to each of the wet processing unit 10 and the dry processing unit 20 in each processing module 100 using the hand.

The transportation robot TR including the hand and the hand drive mechanism can move along the direction D2. Accordingly, the transportation robot TR can face each of the wet processing unit 10 and the dry processing unit 20, which are disposed separately from each other in the direction D2, in the arrangement direction D1. The transportation robot TR can receive and give the substrate W from and to each of the wet processing unit 10 and the dry processing unit 20.

In the meanwhile, the transfer unit 30 is provided between the wet processing unit 10 and the dry processing unit 20. Thus, the transfer unit 30 (for example, the hand and the hand drive mechanism) needs not move in the direction D2. That is to say, a movement mechanism moving the transfer unit 30 needs not be provided.

Figure 2:
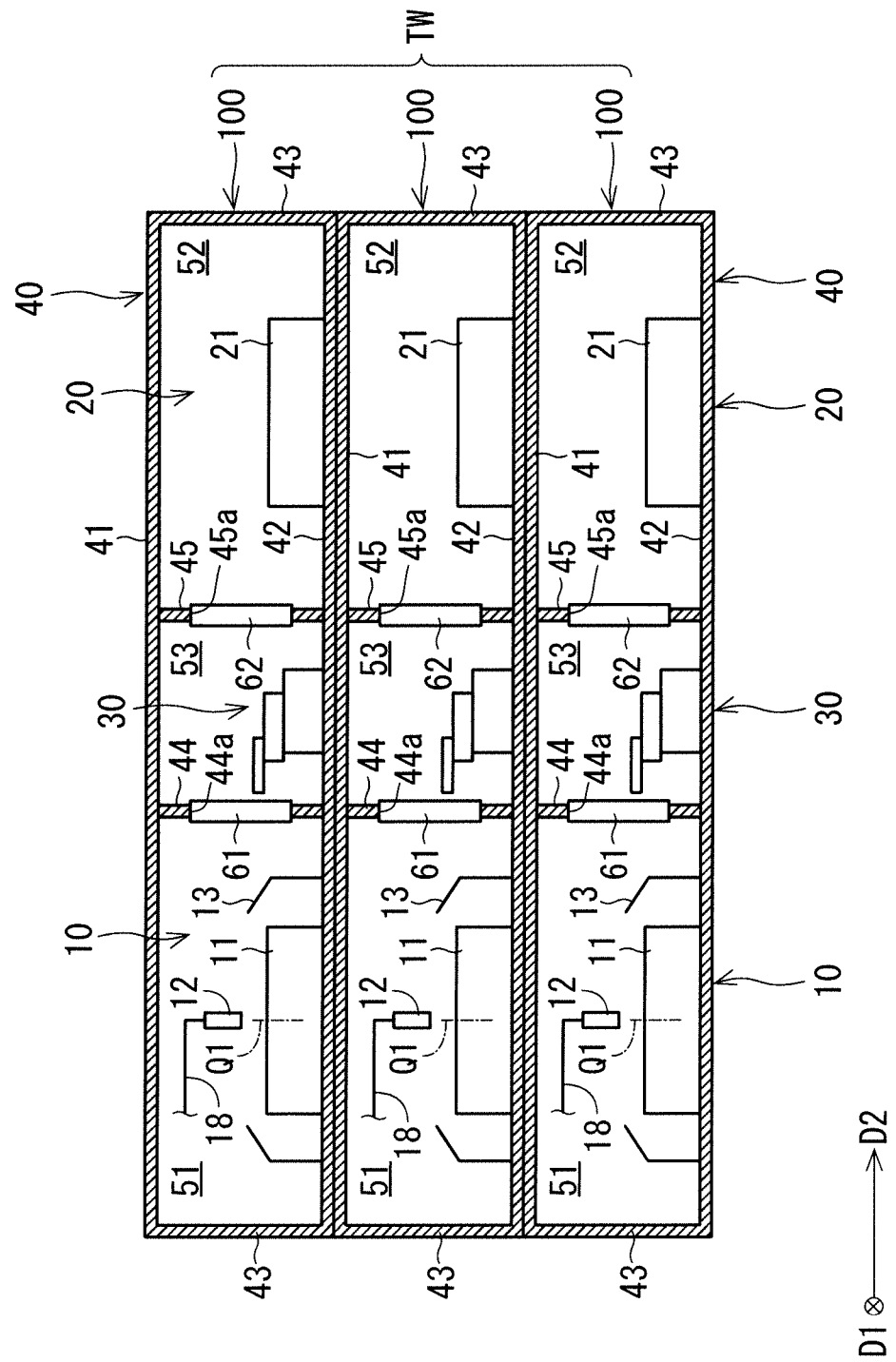
FIG. 2 is a side view schematically illustrating an example of a configuration of a processing module.

In the example in FIG. 1, the plurality of processing modules 100 are disposed in a plan view. However, the processing modules 100 in a plurality of stages may be stacked in the vertical direction. FIG. 2 is a sectional side view schematically illustrating an example of a configuration of the plurality of processing modules 100. In this case, the processing modules 100 in the plurality of stages stacked in the vertical direction constitute one tower TW. In the example in FIG. 1, the two towers TW are disposed to face each other with the transportation space 55 therebetween in a plan view.

In this case, the transportation robot TR (for example, the hand and the hand drive mechanism) can go up and down by an up-down mechanism such as a ball screw mechanism, for example, and can stop at a position facing the processing module 100 in each stage. The transportation robot TR can receive and give the substrate W from and to each of the wet processing unit 10 and the dry processing unit 20 of the processing module 100 in each stage.

The controller 200 controls an operation of the substrate processing device 1. For example, the controller 200 controls various types of configuration of the indexer robot IR, the transportation robot TR, and the processing module 100. The controller 200 controls the aforementioned various operation mechanisms provided in the substrate processing device 1.

The controller 200 is similar in hardware configuration to a typical computer. That is to say, the controller 200 includes a central processing unit (CPU) performing various types of arithmetic processing, a read only memory (ROM) which is a read-only memory to store a basic program, a random access memory (RAM) which is a readable/writable memory to store various types of information, and a magnetic disk which stores control software or data. The CPU in the controller 200 executes a predetermined processing program, whereby processing performed on the substrate W in the substrate processing device 1 proceeds. Part or all of the functions of the controller 200 may be executed by a dedicated hardware circuit.

<Configuration of Plurality of Processing Modules>
<Chassis>

As exemplified in FIG. 2, each processing module 100 includes a chassis 40 housing the wet processing unit 10, the dry processing unit 20, and the transfer unit 30. The chassis 40 has a rectangular box-like shape, for example, and a longitudinal direction thereof follows the direction D2.

The chassis 40 includes a ceiling part 41, a floor part 42, a sidewall 43, an inner wall 44, and an inner wall 45. The ceiling part 41, the floor part 41, and the sidewall 43 are connected to each other to form an inner space. The inner space is an enclosed space, for example.

The inner wall 44 and the inner wall 45 are provided in the inner space to face each other in the direction D2. The inner wall 44 and the inner wall 45 are walls each partitioning the inner space into the wet processing space 51, the dry processing space 52, and a transfer space 53. Specifically, the inner wall 44 is a wall partitioning the wet processing space 51 and the transfer space 53, and is provided in a posture that a thickness direction thereof follows the direction D2. The inner wall 45 is a wall partitioning the transfer space 53 and the dry processing space 52, and is provided in a posture that a thickness direction thereof follows the direction D2. These wet processing space 51, the transfer space 53, and the dry processing space 52 are arranged in this order along the direction D2. The wet processing space 51, the dry processing space 52, and the transfer space 53 are enclosed spaces, for example.

A shape of the chassis 40 is not particularly limited, and shapes of the wet processing space 51, the dry processing space 52, and the transfer space 53 are not also particularly limited. For example, shapes of the chassis 40 and the inner wall 45 may be designed so that the dry processing space 52 has a cylindrical shape.

The wet processing unit 10 is housed in the wet processing space 51, the transfer unit 30 is housed in the transfer space 53, and the dry processing unit 20 is housed in the dry processing space 52.

An opening 44a is formed in the inner wall 44. The opening 44a passes through the inner wall 44 along the direction D2, and has a size to be able to pass the hand of the transfer unit 30 and the substrate W. A shutter 61 opening and closing the opening 44a is also provided in the inner wall 44. The controller 200 controls the shutter 61. The shutter 61 closes the opening 44a, thereby partitioning the wet processing space 51 and the transfer space 53. When the shutter 61 is opened, the wet processing space 51 and the transfer space 53 are connected to each other via the opening 44a. The transfer unit 30 can receive and give the substrate W from and to the wet processing unit 10 via the opening 44a.

An opening 45a is formed in the inner wall 45. The opening 45a passes through the inner wall 45 along the direction D2, and has a size to be able to pass the hand of the transfer unit 30 and the substrate W. A shutter 62 opening and closing the opening 45a is also provided in the inner wall 45. The controller 200 controls the shutter 62. The shutter 62 closes the opening 45a, thereby partitioning the transfer space 53 and the dry processing space 52. When the shutter 62 is opened, the transfer space 53 and the dry processing space 52 are connected to each other via the opening 45a. The transfer unit 30 can receive and give the substrate W from and to the dry processing unit 20 via the opening 45a.

As exemplified in FIG. 1, an opening 43a and a shutter 63 for transporting the substrate W between the transportation robot TR and the wet processing unit 10 are provided in a sidewall 431 of the sidewall 43 having contact with the transportation space 55. Specifically, the opening 43a and the shutter 63 are provided in part of the sidewall 431 having contact with the wet processing space 51. The opening 43a passes through the sidewall 431 along the arrangement direction D1, and has a size to be able to pass the hand of the transportation robot TR and the substrate W. The controller 200 controls the shutter 63. The shutter 63 closes the opening 43a, thereby partitioning the wet processing space 51 and the transportation space 55. When the shutter 63 is opened, the wet processing space 51 and the transportation space 55 are connected to each other via the opening 43a. The transportation robot TR can receive and give the substrate W from and to the wet processing unit 10 via the opening 43a.

In the similar manner, an opening 43b and a shutter 64 are provided in part of the sidewall 431 having contact with the dry processing space 52. The opening 43b also passes through the sidewall 431 along the arrangement direction D1, and has a size to be able to pass the hand of the transportation robot TR and the substrate W. The controller 200 controls the shutter 64. The shutter 64 closes the opening 43b, thereby partitioning the dry processing space 52 and the transportation space 55. When the shutter 64 is opened, the dry processing space 52 and the transportation space 55 are connected to each other via the opening 43b. The transportation robot TR can receive and give the substrate W from and to the dry processing unit 20 via the opening 43b.

In the example in FIG. 2, the processing module 100 with three stages is provided, however, the configuration is not limited thereto. The processing module 100 with a single stage or two stages may be provided, or the processing module 100 with four or more stages may also be provided.

Although the illustration is omitted in FIG. 2, a space for routing various pipes (described hereinafter) of the wet processing unit 10 and the dry processing unit 20 may be formed. For example, it is also applicable that an inner space for routing the pipe is formed between the ceiling part 41 and the floor part 42 adjacent to each other in the vertical direction and the pipe is housed in the inner space.

Figure 3:
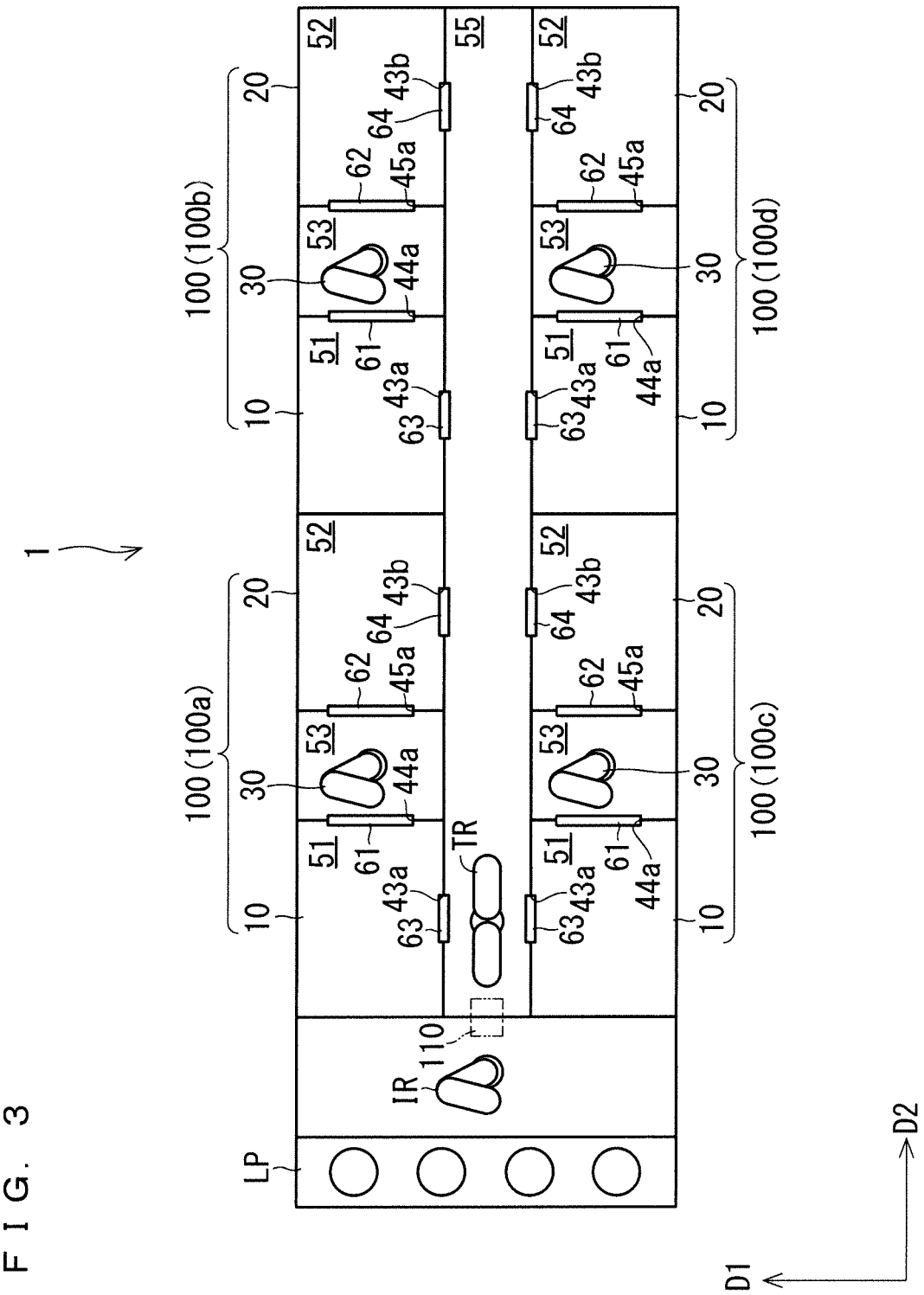
FIG. 3 is a plan view schematically illustrating another example of a configuration of the substrate processing device.

The plurality of processing modules 100 may be disposed side by side along the direction D2. FIG. 3 is a plan view schematically illustrating an example of another example of the configuration of the substrate processing device 1. In the example in FIG. 3, processing modules 100a to 100d are provided as the four processing modules 100 in a plan view. The processing modules 100a and 100b are disposed adjacent to each other in the direction D2, and the processing modules 100c and 100d are disposed adjacent to each other in the direction D2. The transportation space 55 is formed between a group of processing modules 100a and 100b and a group of processing modules 100c and 100d. The processing modules 100a and 100c face each other in the arrangement direction D1, and the processing modules 100b and 100d face each other in the arrangement direction D1.

In this case, a movable amount of the transportation robot TR in the direction D2 is larger than the case in FIG. 1. The transportation robot TR can move along the direction D2 to such a degree that it can stop at a position facing each of the wet processing unit 10 and the dry processing 20 of the processing module 100a and each of the wet processing unit 100 and the dry processing unit 20 of the processing module 100b. The transportation robot TR can also stop at a position facing each of the wet processing unit 10 and the dry processing unit 20 of the processing modules 100c and 100d.

In the example in FIG. 3, the two processing modules 100 are adjacent to each other in the direction D2, however, three or more processing modules 100 may be adjacent to each other in the direction D2.

<Wet Processing Unit>

As exemplified in FIG. 2, the wet processing unit 10 includes a substrate holding part 11, a nozzle 12, and a cap 13. The substrate holding part 11, the nozzle 12, and the cap 13 are housed in the wet processing space 51.

The substrate holding part 11 holds the substrate W in a horizontal posture. The horizontal posture herein indicates a posture in which a thickness direction of the substrate W follows the vertical direction. A substrate holding part holding a peripheral edge of the substrate W with a plurality of chuck pins or a substrate holding part sucking and holding a lower surface of the substrate W may be adopted as the substrate holding part 11, for example.

The substrate holding part 11 rotates the substrate W around a rotation axis line Q1 with a rotation mechanism such as a motor, for example. The rotation axis line Q1 is an axis line extending in the vertical direction through a center part of the substrate W. Such a substrate holding part 11 is also referred to as a spin chuck. The controller 200 controls a holding operation and a rotation operation of the substrate holding part 11.

The nozzle 12 discharges a processing solution to a main surface of the substrate W held by the substrate holding part 11. In the example in FIG. 2, the nozzle 12 is located on a vertically upper side with respect to the substrate W held by the substrate holding part 11 and discharges the processing solution to the upper surface of the substrate W. When the processing solution is discharged to the substrate W being rotated, the processing solution reaching an upper surface of the substrate W flows to a peripheral edge side of the substrate W in accordance with centrifugal force, and scatters from the peripheral edge to outside. Accordingly, the wet processing corresponding to a type of the processing solution can be performed on the substrate W.

The nozzle 12 is connected to a processing solution supply source (not shown) via a processing solution supply tube 18. A valve (not shown) is provided in the processing solution supply tube 18, and discharge and stop of the processing solution is switched by opening and closing the valve. The controller 200 controls the valve.

The nozzle 12 may supply plural types of processing solution to the substrate W. That is to say, it is also applicable that the processing solution supply tube 18 includes branch paths, and end portions of the branch paths are connected to plural types of processing solution supply sources, respectively. In this case, a valve is provided in each of the branch paths. It is also applicable that the plurality of nozzles 12 are provided and connected to different processing solution supply sources via the processing solution supply tube 18, respectively.

The cap 13 has a cylindrical shape and surrounds the substrate holding part 11. The cap 13 receives the processing solution scattering from the peripheral edge of the substrate W. The cap 13 may be provided to go up and down. In this case, the controller 200 controls the up-down movement of the cap 13.

When the processing solution is discharged from the nozzle 12, some processing solution vaporizes or the processing solution scatters, and a vaporized component or a minute liquid drop of the processing solution may be spread in the wet processing space 51. That is to say, the vaporized component and the minute liquid drop of the processing solution are included in the wet processing space 51.

Figure 4:
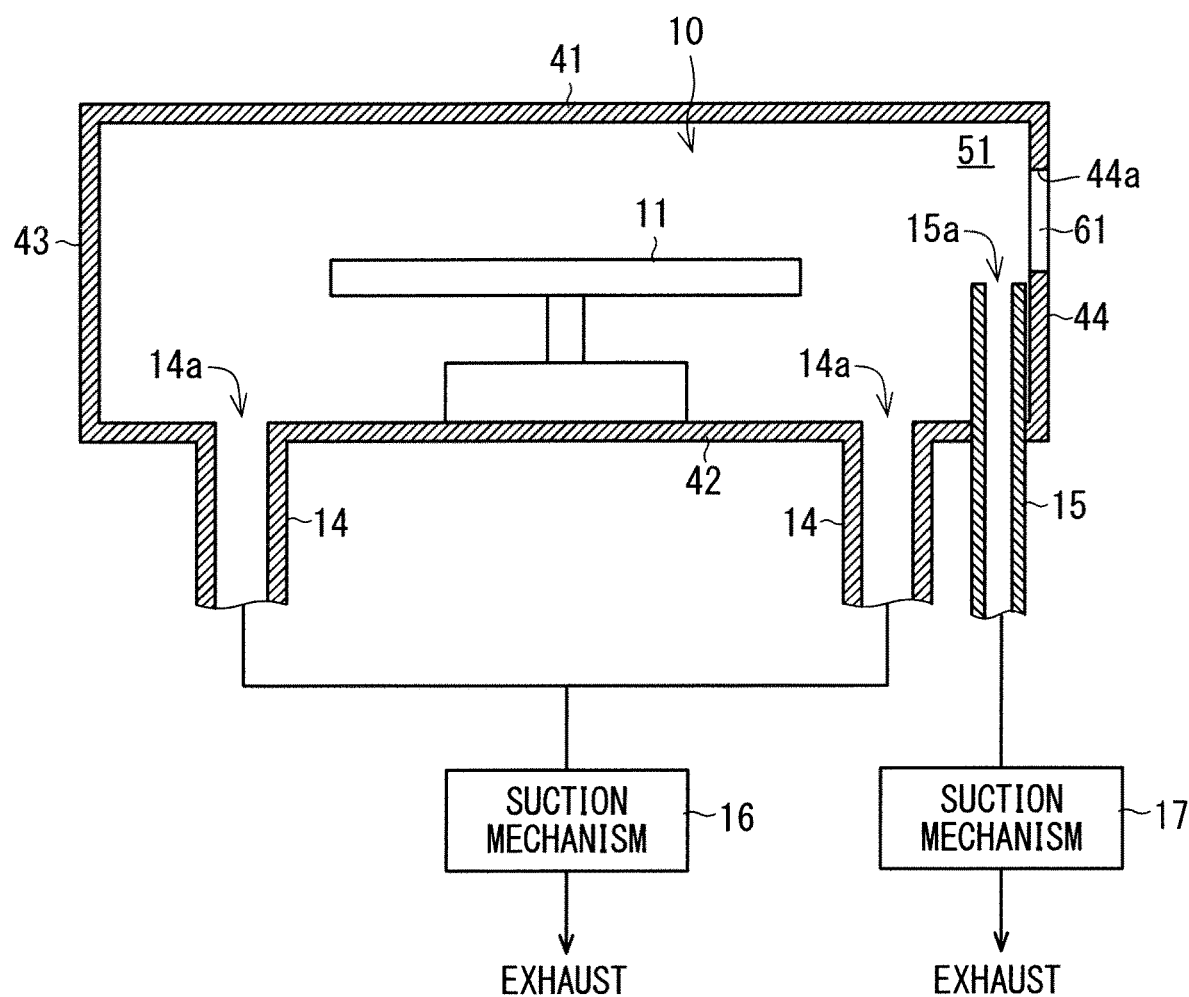
FIG. 4 is a drawing schematically illustrating an example of a configuration of a wet processing unit.

Thus, the wet processing unit 10 may include a mechanism for exhausting gas (referred to as atmosphere gas) in the wet processing space 51. FIG. 4 is a drawing schematically illustrating an example of a configuration of the wet processing unit 10, and the illustration of the nozzle 12, the cap 13, and the processing solution supply tube 18 is omitted in the example in FIG. 4.

In the example in FIG. 4, a wet suction tube 14 is provided. A suction inlet 14a of the wet suction tube 14 is opened in the wet processing space 51. As a specific example, the suction inlet 14a of the wet suction tube 14 is formed in an upper surface of the floor part 42 of the chassis 40, and is opened to the wet processing space 51. The suction inlet 14a has a circular shape in a plan view, for example.

The wet suction tube 14 is connected to a suction mechanism 16. The suction mechanism 16 includes a pump, for example, and sucks the atmosphere gas in the wet suction tube 14. The controller 200 controls the suction mechanism 16. A dedicated suction mechanism for the substrate processing device 1 (a pump, for example) may be adopted as the suction mechanism 16, or factory utility facilities which can also be used for the other device may also be adopted. The atmosphere gas in the wet processing space 41 is sucked in the suction inlet 14a by the suction operation of the suction mechanism 16, and exhausted outside through the wet suction tube 14. Accordingly, accumulation of the vaporized component or the minute liquid drop of the processing solution in the wet processing space 51 can be suppressed.

In the example in FIG. 4, two wet suction tubes 14 are provided. The suction inlet 14a of one wet suction tube 14 is formed on an opposite side of the substrate holding part 11 from the suction inlet 14a of the other wet suction tube 14. One wet suction tube 14 may be provided, or three or more wet suction tubes 14 may also be provided.

Pressure in the wet processing space 51 may be adjusted to have a slightly smaller value (for example, 750 Torr) than that of atmospheric pressure by the suction operation of the suction mechanism 16. Accordingly, the pressure in the wet processing space 51 gets smaller than that in the transportation space 55. Thus, an amount of atmosphere gas flowing from the wet processing space 51 to the transportation space 55 can be reduced when the shutter 63 is opened. Furthermore, occurrence of defect (for example, deterioration of a material) caused by the vaporized component or the minute liquid drop of the processing solution adhering to various configurations in the transportation space 55 can be suppressed.

In the example in FIG. 4, a wet suction tube 15 is also provided in the wet processing unit 10, but is described in detail hereinafter.

<Dry Processing Unit>

Figure 5:
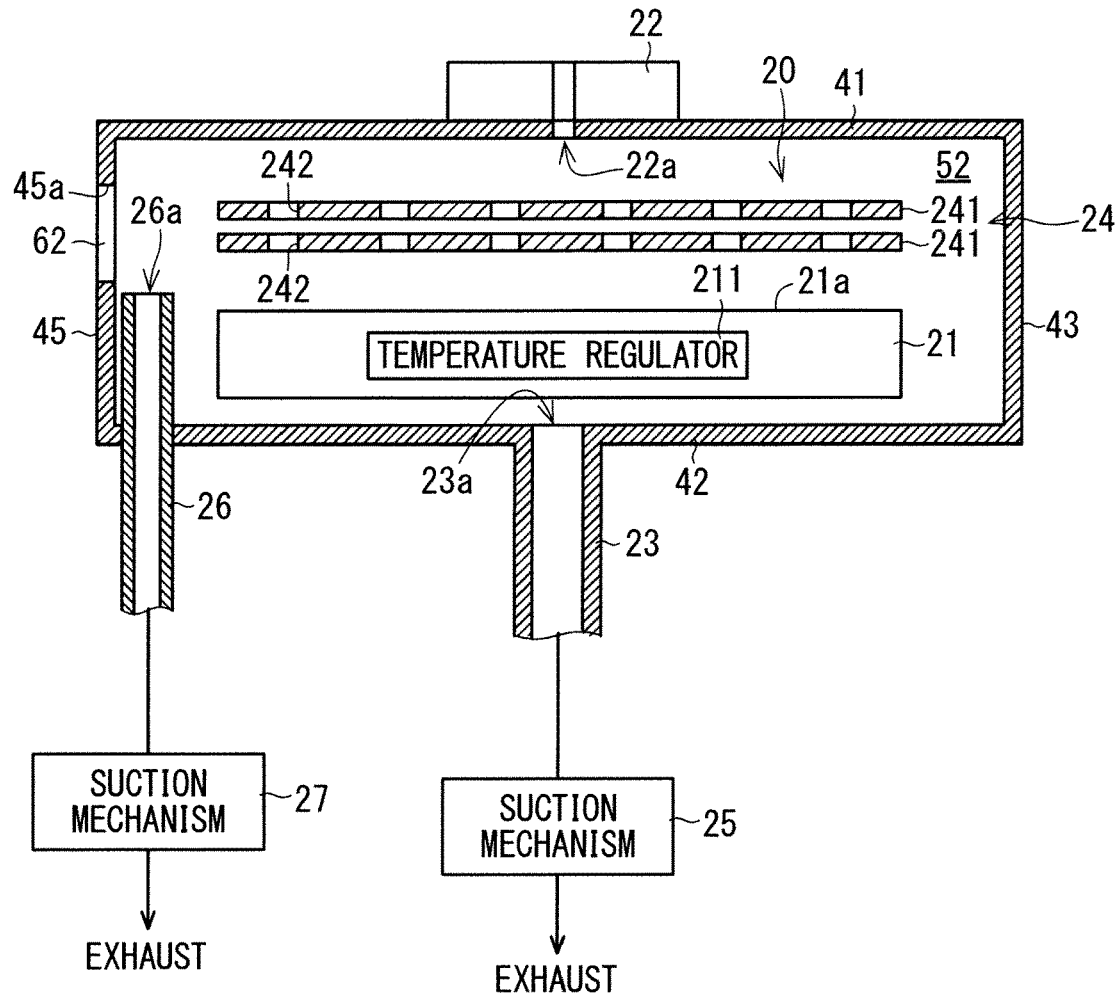
FIG. 5 is a drawing schematically illustrating an example of a configuration of a dry processing unit.

FIG. 5 is a drawing schematically illustrating an example of a configuration of the dry processing unit 20. The dry processing unit 20 includes a substrate installation part 21, a gas supply part 22 and a dry suction tube 23.

The substrate installation part 21 is housed in the dry processing space 52. The substrate installation part 21 is a member on which the substrate W is disposed in a horizontal posture. The substrate installation part 21 has an installation surface 21a, and the substrate W is disposed on the installation surface 21a. The substrate installation part 21 may hold the substrate W by a chuck pin or suction, for example.

In the example in FIG. 5, a temperature regulator 211 is provided in the dry processing unit 20. As exemplified in FIG. 5, the temperature regulator 211 may be built in the substrate installation part 21. The temperature regulator 211 adjusts a temperature of the substrate W disposed on the installation surface 21a of the substrate installation part 21. More specifically, the temperature regulator 211 adjusts the temperature of the substrate W so that the temperature of the substrate W is within a temperature range appropriate for the dry processing. The controller 200 controls the temperature regulator 211.

The temperature regulator 211 includes a heater, for example. The heater has a heating wire, and Joule heat is generated when electrical current flows in the heating wire.

The heat is transmitted to the substrate W, and the substrate W is heated. Alternatively, the temperature regulator 211 includes a cooling unit. The cooling unit includes a Peltier element or a refrigerant pipe, for example, to absorb heat around the cooling unit. Accordingly, the substrate W is cooled.

The gas supply part 22 supplies processing gas to the dry processing space 52. In the example in FIG. 5, the gas supply part 22 supplies the processing gas to the substrate W from a vertically upper side with respect to the substrate W disposed on the substrate installation part 21. The gas supply part 22 includes a supply port 22a formed in a lower surface of the ceiling part 41 of the chassis 40, for example, and the supply port 22a is opened to the dry processing space 52. In the example in FIG. 5, the supply port 22a is formed in a position facing the substrate installation part 21 in the vertical direction.

The gas supply part 22 includes a pipe having an internal flow path with the supply port 22a as one end opening, and supplies the processing gas from the supply port 22a to the dry processing space 52. The pipe is connected to a processing gas supply source (not shown) and a valve (not shown) is provided in the pipe. The controller 200 controls the valve. Supply and stop of the processing gas is switched by opening and closing the valve.

In the example in FIG. 5, a rectifying part 24 is provided between the supply port 22a of the gas supply part 22 and the substrate installation part 21. The rectifying part 24 includes a rectifying plate 241, for example. In the example in FIG. 5, two rectifying plates 241 are provided at intervals in the vertical direction. The rectifying plate 241 is a punching plate, for example, and is provided so that a thickness direction thereof follows the vertical direction. A plurality of openings 242 passing through the rectifying plate 241 in the thickness direction are formed in the rectifying plate 241. The plurality of openings 242 are two-dimensionally arranged in a plan view, and is arranged in a matrix form, for example.

The processing gas supplied from the supply port 22a passes through the rectifying part 24 (specifically, the opening 242), thereby being rectified, and flows to the upper surface of the substrate W. The processing gas acts on the upper surface of the substrate W, thus the dry processing corresponding to the type of the processing gas can be performed.

Ozone gas, for example, can be adopted as the processing gas. Examples of the processing using ozone gas include processing of forming an oxide film. When silicon is exposed to the upper surface of the substrate W, for example, ozone gas acts on the upper surface of the substrate W being heated, thus a silicon oxide film can be formed on the upper surface of the substrate W.

Examples of the processing using ozone gas include resist removal processing. For example, when a resist made of carbon elements, hydrogen elements, and oxygen elements is formed on the upper surface of the substrate W, the ozone gas acts on the resist of the substrate W, and can remove the resist.

The dry suction tube 23 is a pipe for exhausting the gas in the dry processing space 52 (referred to as the atmosphere gas). A suction inlet 23a of the dry suction tube 23 is opened in the dry processing space 52. In the example in FIG. 5, the suction inlet 23a of the dry suction tube 23 is formed on the upper surface of the floor part 42 of the chassis 40. The suction inlet 23a has a circular shape in a plan view, for example.

The dry suction tube 23 is connected to a suction mechanism 25. The suction mechanism 25 includes a pump, for example, and sucks the gas in the dry suction tube 23. A dedicated suction mechanism for the substrate processing device 1 (a pump, for example) may be adopted as the suction mechanism 25, or factory utility facilities which can also be used for the other device may also be adopted. The controller 200 controls the suction mechanism 25. The atmosphere gas in the dry processing space 52 is sucked in the suction inlet 23a by the suction operation of the suction mechanism 25, and exhausted outside through the dry suction tube 23. Accordingly, the processing gas which does not contribute to the reaction of the substrate W and unnecessary gas generated by the reaction of the substrate W with the processing gas can be exhausted to outside. In the example in FIG. 5, one dry suction tube 23 is provided, however, two or more dry suction tubes 23 may also be provided.

The ozone gas is dangerous when leaked, thus it is also applicable that an ozone gas detector (not shown) is disposed in an exhaust line and the gas supply part 22 stops the supply of the ozone gas when the ozone gas detector detects the ozone gas.

Pressure in the dry processing space 52 may be adjusted to have a slightly smaller value (for example, 750 Torr) than that of atmospheric pressure by the suction operation of the suction mechanism 25. Accordingly, the pressure in the dry processing space 52 gets smaller than that in the transportation space 55. Thus, an amount of atmosphere gas flowing from the dry processing space 52 to the transportation space 55 can be reduced when the shutter 64 is opened. Furthermore, occurrence of defect (for example, deterioration of a material) caused by the gas such as the processing gas adhering to various configurations in the transportation space 55 can be suppressed.

In the example in FIG. 5, a dry suction tube 26 is also provided in the dry processing unit 20, but is described in detail hereinafter.

<Transfer Unit>

Figure 6:
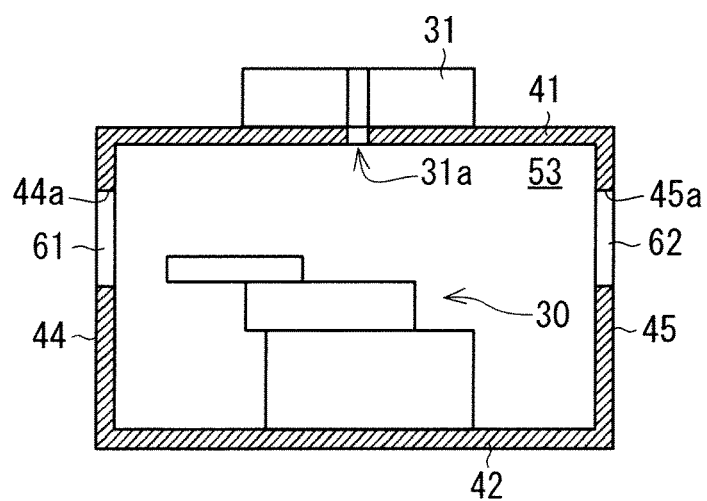
FIG. 6 is a function block diagram schematically illustrating an example of a transfer unit.

FIG. 6 is a drawing illustrating an example of a configuration of the transfer unit 30. The transfer unit 30 is housed in the transfer space 53. As exemplified in FIG. 6, inactive gas may be supplied to the transfer space 53 by the gas supply part 31. The inactive gas herein indicates gas having low reactivity with the substrate W. The inactive gas includes at least one of noble gas such as argon gas and nitrogen gas as a specific example.

In the example in FIG. 6, the gas supply part 31 includes a supply port 31a formed in the lower surface of the ceiling part 41, and the supply port 31a is opened to the transfer space 53. The gas supply part 31 includes a pipe having an internal flow path with the supply port 31a as one end opening, and supplies the inactive gas from the supply port 31a to the transfer space 53. The pipe is connected to an inactive gas supply source (not shown) and a valve (not shown) is provided in the pipe. The controller 200 controls the valve, and supply and stop of the inactive gas is switched by opening and closing the valve.

The gas supply part 31 supplies the inactive gas to the transfer space 53, thereby adjusting the pressure in the transfer space 53 to have a slightly larger value than that of the atmospheric pressure. The pressure in the transfer space 53 is larger than both the pressure in the wet processing space 51 and the pressure in the dry processing space 52.

Even in a case where the gas supply part 31 is not provided, when the wet suction tube 14 and the dry suction tube 23 are provided, the pressure in the transfer space 53 may be larger than both the pressure in the wet processing space 51 and the pressure in the dry processing space 52. In spite of that, the atmosphere gas in the transfer space 53 flows out every time each of the shutter 61 and the shutter 62 opens, thus the pressure in the transfer space 53 may gradually decrease. Thus, a pressure difference between the transfer space 53 and the wet processing space 51 and a pressure difference between the transfer space 53 and the dry processing space 52 may decrease.

In contrast, when the gas supply part 31 is provided, the value of each pressure difference can be kept larger.

When the pressure in the transfer space 53 is larger than the pressure in the wet processing space 51, an amount of atmosphere gas flowing from the wet processing space 51 to the transfer space 53 when the shutter 61 is opened can be reduced. Furthermore, the flowing of the atmosphere gas in the wet processing space 51 into the dry processing space 52 through the transfer space 53 can also be suppressed. Accordingly, a defect caused by the vaporized component or the minute liquid drop of the processing solution adhering to various configurations in the transfer space 53 and the dry processing space 52 can be suppressed.

In the similar manner, when the pressure in the transfer space 53 is larger than the pressure in the dry processing space 52, an amount of atmosphere gas flowing from the dry processing space 52 to the transfer space 53 when the shutter 62 is opened can be reduced. Furthermore, the flowing of the atmosphere gas in the dry processing space 52 into the wet processing space 51 through the transfer space 53 can also be suppressed. Accordingly, a defect caused by the gas such as the processing gas adhering to various configurations in the transfer space 53 and the wet processing space 51 can be suppressed.

<Example of Operation of Substrate Processing Device 1>

An example of a flow of an operation of the substrate processing device 1 is described next. A resist is formed on the upper surface of the substrate W and the substrate processing device 1 removes the resist, as the example.

Figure 7:
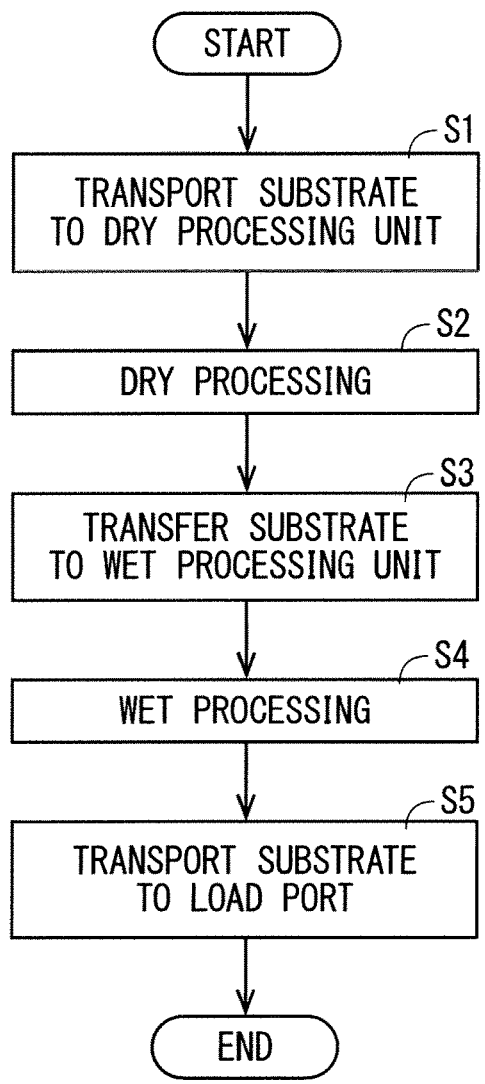
FIG. 7 is a flow chart showing an example of an operation of the substrate processing device.

FIG. 7 is a flow chart showing the example of the operation of the substrate processing device 1. Firstly, the substrate W in a carrier held in the load port LP is transported to the dry processing unit 20 (Step S1). Specifically, the indexer robot IR sequentially takes the substrate W out of the carrier held by the load port LP one by one, and sequentially transports the substrate W to the transportation robot TR. The transportation robot TR sequentially transports the substrate W to an empty dry processing unit 20 in the plurality of the dry processing units 20. Specifically, the transportation robot TR moves to a position facing the empty dry processing unit 20, and the shutter 64 of its dry processing unit 20 is opened. The transportation robot TR carries the substrate W in the dry processing unit 20 via the opening 43b. Accordingly, the substrate W is disposed on the installation surface 21a of the substrate installation part 21. Next, the shutter 64 is closed.

The transportation robot TR sequentially transports the substrate W to the empty dry processing unit 20 in this manner. Accordingly, the substrates W are carried in the plurality of dry processing units 20.

Herein, the atmosphere gas in the dry processing space 52 is exhausted to outside through the dry suction tube 23, and the pressure in the dry processing space 52 is adjusted to have a slightly smaller value than that of the atmospheric pressure. Thus, the flowing of the atmosphere gas from the dry processing space 52 to the transportation space 55 can be suppressed in carrying the substrate W in the dry processing unit 20.

Each dry processing unit 20 in which the substrate W is carried performs the dry processing on the substrate W (Step S2). Specifically, the temperature regulator 211 adjusts the temperature of the substrate W to be within a regulated range appropriate for the resist removal processing. When the temperature of the substrate W is within the regulated range, the gas supply part 22 supplies the ozone gas as the processing gas to the upper surface of the substrate W. The ozone gas reacts with the resist on the upper surface of the substrate W, thus the resist is removed.

The temperature regulator 211 adjusts the temperature of the substrate W within the regulated range, thus the reaction of the resist with the ozone gas can be promoted. In other words, the temperature regulator 211 adjusts the temperature of the substrate W within a range appropriate for promoting the reaction.

When a predetermined period of time has passed after starting the supply of the ozone gas, the gas supply part 22 stops the supply of the ozone gas. Accordingly, the resist removal processing is finished. The temperature regulator 211 may stop adjusting the temperature of the substrate W.

The resist on the upper surface of the substrate W is removed by the resist removal processing, however, carbon constituting the resist may remain on the upper surface of the substrate W. The remaining carbon is unnecessary, thus is desired to be removed from the substrate W. Thus, the remaining carbon on the substrate W is washed and removed by the wet processing.

Firstly, the transfer unit 30 transfers the substrate W from the dry processing unit 20 to the wet processing unit 10 (Step S3). Specifically, after the shutter 62 is opened, the transfer unit 30 carries the substrate W out of the dry processing unit 20, and then the shutter 62 is closed. After the shutter 61 is opened, the transfer unit 30 carries the substrate W in the wet processing unit 10. Accordingly, the substrate W is held by the substrate holding part 11. Then, the shutter 61 is closed.

Herein, the gas supply part 31 supplies the inactive gas to the transfer space 53, and the pressure in the transfer space 53 is adjusted to have a slightly larger value than that of the atmospheric pressure. The atmosphere gas in the wet processing space 51 is exhausted to outside through the wet suction tube 14, and the pressure in the wet processing space 51 is adjusted to have a slightly smaller value than that of the atmospheric pressure. The atmosphere gas in the dry processing space 52 is exhausted to outside through the dry suction tube 23, and the pressure in the dry processing space 52 is adjusted to have a slightly smaller value than that of the atmospheric pressure. Thus, the flowing of the atmosphere gas out of the dry processing space 52 and the flowing of the atmosphere gas out of the wet processing space 51 are suppressed in transferring the substrate W from the dry processing unit 20 to the wet processing unit 10.

The wet processing unit 10 in which the substrate W is carried performs the wet processing on the substrate W (Step S4). Specifically, the substrate holding part 11 rotates the substrate W around the rotation axis line Q1 while horizontally holding the substrate W. Then, a processing solution is discharged from the nozzle 12 toward a center part of the main surface (the upper surface herein) of the substrate W being rotated. The processing solution is a wash solution for removing remaining carbon on the substrate W, and is SC1, hydrofluoric acid, or sulfuric acid, for example.

The processing solution reaching the upper surface of the substrate W spreads on the upper surface of the substrate W in accordance with centrifugal force, and scatters from the peripheral edge of the substrate W to outside. Accordingly, the remaining carbon on the upper surface of the substrate W is removed.

The nozzle 12 may sequentially discharge various processing solutions as necessary. For example, after discharging the wash solution, the nozzle 12 discharges a rinse solution to the upper surface of the substrate W to rinse away the wash solution. Subsequently, the supply of the processing solution from the nozzle 12 is stopped, and the substrate holding part 11 increases a rotation speed of the substrate W to dry the substrate W (a so-called spin-drying). Accordingly, the substrate W can be washed and dried.

When the processing in the wet processing unit 10 is finished, the substrate W is transported to the load port LP (Step S5). Specifically, the shutter 63 is opened, and the transportation robot TR carries the substrate W out of the wet processing unit 10. Then, the shutter 63 is closed.

Herein, the pressure in the wet processing space 51 is adjusted to have a slightly smaller value than that of the atmospheric pressure. Thus, the flowing of the atmosphere gas from the wet processing space 51 to the transfer space 53 is suppressed in carrying the substrate W out of the wet processing unit 10 by the transportation robot TR.

The transportation robot TR sequentially carries the substrate W out of the wet processing unit 10 on which the processing has been finished, gives the substrate W to the indexer robot IR in each time, and the indexer robot IR sequentially carries the substrate W in the carrier of the load port LP.

In the manner described above, the substrate processing device 1 continuously performs the dry processing and the wet processing on the substrate W.

Effect of Embodiment

According to this substrate processing device 1, the transfer unit 30 transfers the substrate W between the wet processing unit 10 and the dry processing unit 20 in each processing module 100.

Considered for comparison is a case where the transportation robot TR transports the substrate W between the wet processing unit 10 and the dry processing unit 20. In this case, during a period in which the transportation robot TR transports the substrate W between the load port LP and the processing module 100, the substrate W cannot be transported between the wet processing unit 10 and the dry processing unit 20.

In contrast, according to the substrate processing device 1, even when the transportation robot TR transports the substrate W between the load port LP and the processing module 100, the transfer unit 30 can transfer the substrate W between the wet processing unit 10 and the dry processing unit 20 in each processing module 100. Thus, the substrate W can be transferred immediately between the wet processing unit 10 and the dry processing unit 20.

In the operation example in FIG. 7, after the dry processing unit 20 performs the dry processing on the substrate W (Step S2), the transfer unit 30 immediately transfers the substrate W from the dry processing unit 20 to the wet processing unit 10 (Step S3). Thus, the wet processing (Step S4) can be started immediately after the dry processing (Step S2).

In the operation example described above, the resist removal processing using ozone gas is adopted as the dry processing. The resist is an organic compound containing carbon, and reacts with ozone, thereby being resolved and removed. After such resist removal processing, carbon may remain on the upper surface of the substrate W. Such remaining carbon may be taken in an oxide film made up of a base film (for example, silicon) reacting with oxygen in the air and oxidized, thus carbon is hardly removed as time passes.

According to the substrate processing device 1, the substrate W can be transferred to the wet processing unit 10 immediately after the resist removal processing performed by the dry processing unit 20, and the wet processing can be performed on the substrate W. Thus, the wet processing can be started in a state where the remaining carbon can be easily removed. Accordingly, the remaining carbon on the substrate W can be appropriately removed.

According to the substrate processing device 1, a high-vacuum decompression chamber referred to as a so-called load lock or air lock is not provided between the wet processing unit 10 and the dry processing unit 20. That is to say, the substrate W is transferred between the wet processing unit 10 and the dry processing unit 20 without passing through a decompression space in a decompression chamber. A time of transporting the substrate W between the wet processing unit 10 and the dry processing unit 20 can be reduced also by this configuration.

The load lock or the air lock is not necessary, thus a footprint of the substrate processing device 1 can also be reduced.

<Dry Processing>

The resist removal processing is described as an example of the dry processing in the above example. The other dry processing is described hereinafter.

<Gas Phase Etching Processing (Without Ultraviolet Light)>

Gas phase etching processing using etching gas may be adopted as the dry processing. A configuration of the dry processing unit 20 in this case is similar to that in FIG. 5, for example. However, the gas supply part 22 supplies etching gas as processing gas to the dry processing space 52. The etching gas is gas capable of etching an object to be etched on the upper surface of the substrate W, and includes reactive gas containing elemental fluorine such as hydrogen fluoride gas or fluorine gas, for example. The etching gas may further include additive gas having hydroxyl group (OH group) such as moisture vapor or alcohol gas. The etching gas may further include inactive gas.

The temperature regulator 211 adjusts the temperature of the substrate W so that the temperature of the substrate W is within a regulated range appropriate for the gas phase etching processing.

The gas supply part 22 supplies the etching gas to the dry processing space 52 in a state where the temperature of the substrate W is adjusted within the regulated range. When the etching gas is supplied to the upper surface of the substrate W, the etching gas reacts with an object to be etched, and removes the object. After such gas phase etching processing is finished, fluorine may remain on the upper surface of the substrate W.

The nozzle 12 of the wet processing unit 10 discharges a wash solution (for example, sulfuric acid) as a processing solution for removing fluorine. Accordingly, the remaining fluorine on the upper surface of the substrate W can be washed and removed.

An example of an operation of the substrate processing device 1 is also similar to that in FIG. 7. However, in Step S2, the dry processing unit 20 performs the gas phase etching processing as described above. Accordingly, the object to be etched on the upper surface of the substrate W can be etched. After the gas phase etching processing is finished, fluorine may remain on the upper surface of the substrate W.

Thus, the wet processing for removing the remaining fluorine is performed subsequent to the gas phase etching processing. Specifically, the transfer unit 30 transfers the substrate W from the dry processing unit to the wet processing unit 10 (Step S3), and the wet processing unit 10 supplies the wash solution such as sulfuric acid from the nozzle 12 to the upper surface of the substrate W to remove the remaining fluorine from the substrate W (Step S4). Then, the wet processing unit 10 supplies a rinse solution from the nozzle 12 to the upper surface of the substrate W after supplying the wash solution, and subsequently performs dry processing.

As described above, the substrate processing device 1 can perform the etching processing on the substrate W.

When the remaining fluorine reacts with moisture, it may cause a defect (for example, failure or particles) in the substrate W, thus the remaining fluorine is desired to be removed from the substrate W immediately.

According to the substrate processing device 1, the transfer unit 30 is provided to correspond to the wet processing unit 10 and the dry processing unit 20 in each processing module 100. Thus, the transfer unit 30 can transfer the substrate W from the dry processing unit 20 to the wet processing unit 10 immediately after the gas phase etching processing. Thus, the wash processing of removing the remaining fluorine can be started immediately after the gas phase etching processing. Furthermore, the defect occurring in the substrate W can be suppressed more appropriately.

<Gas Phase Etching Processing (With Ultraviolet Light)>

Gas phase etching processing using ultraviolet light may be adopted as the dry processing. A configuration of the dry processing unit 20 in this case includes a light source emitting ultraviolet light in addition to the configuration in FIG. 5, for example. Adoptable as the light source is, for example, a light source such as a low-pressure mercury lamp, a high-pressure mercury lamp, an excimer lamp, a metal halide lamp, or an ultraviolet (UV) light emitting diode (LED). The light source is provided in the dry processing space 52, and emits the ultraviolet light to the etching gas. It is sufficient that the light source is provided in a position capable of supplying the ultraviolet light to the etching gas before the etching gas reaches the substrate W.

The gas supply part 22 includes reactive gas such as mixed gas containing fluorine gas and hydrogen gas or nitrogen trifluoride ($NF_3$) as the etching gas.

The temperature regulator 211 adjusts the temperature of the substrate W so that the temperature of the substrate W is within a regulated range appropriate for the gas phase etching processing.

The gas supply part 22 supplies the etching gas to the dry processing space 52 in a state where the temperature of the substrate W is adjusted within the regulated range, and the light source emits the ultraviolet light to the etching gas. When the ultraviolet light is emitted to the etching gas, the ultraviolet light is absorbed in the etching gas and a radical (for example, fluorine radical) is generated, and the radical reacts with the object to be etched on the upper surface of the substrate W, and removes the object to be etched.

Even after such gas phase etching processing using the ultraviolet light, fluorine may remain on the upper surface of the substrate W. According to the substrate processing device 1, the wet processing can be started immediately after the gas phase etching processing, thus the remaining fluorine can be immediately removed. Furthermore, the defect occurring in the substrate W can be suppressed more appropriately.

<Hydrogen Reduction Processing>

Figure 8:
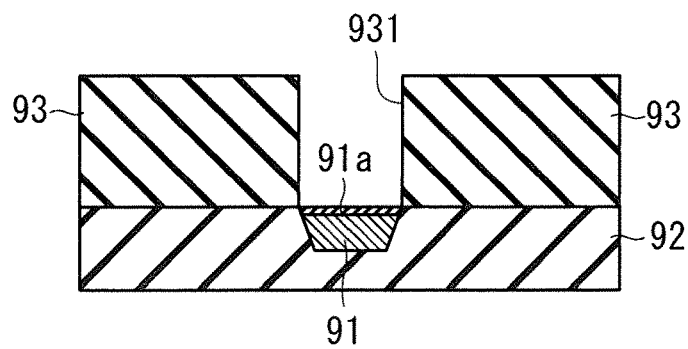
FIG. 8 is a drawing schematically illustrating a part of a film configuration formed on a substrate.

There is a case where a metal film is formed on the upper surface of the substrate W, and in addition, there is a case where a surface of the metal film is oxidized. FIG. 8 is a cross-sectional view schematically illustrating an example of a part of a film configuration formed on the substrate W. In the example in FIG. 8, a metal film 91, an insulating film 92, and an insulating film 93 are formed on the upper surface of the substrate W. In the example in FIG. 8, a concave portion is formed on an upper surface of the insulating film 92, and the metal film 91 is formed to be embedded into the concave portion. The insulating film 93 is formed on the upper surface of the insulating film 92 other than a portion where the metal film 91 is formed. In other words, a via hole 931 connected to an upper surface of the metal film 91 is formed in the insulating film 93. In the example in FIG. 8, the upper surface of the metal film 91 is oxidized, and a metal oxide film 91a is formed. When a wash solution (for example, a polymer wash solution) is supplied to such a substrate W, the metal oxide film 91a on the surface of the metal film 91 is eluted in the wash solution, and the metal film 91 is thinned. Accordingly, a resistance value of the metal film 91 may be larger than a regulated value.

Thus, hydrogen reduction processing using hydrogen gas is performed on the substrate W prior to the wet processing of washing the substrate W. A configuration of the dry processing unit 20 in this case is similar to that in FIG. 5, for example. However, the gas supply part 22 supplies processing gas including hydrogen gas to the dry processing space 52. The processing gas may include gas other than hydrogen gas (for example, inactive gas such as nitrogen gas). In the processing gas, a concentration of hydrogen gas is set to be equal to or smaller than 4 vol %, for example.

The temperature regulator 211 adjusts the temperature of the substrate W so that the temperature of the substrate W is within a regulated range appropriate for the hydrogen reduction processing.

The gas supply part 22 supplies the processing gas to the dry processing space 52 in a state where the temperature of the substrate W is adjusted within the regulated range. When the processing gas is supplied to the upper surface of the substrate W, hydrogen gas reacts with the metal oxide film 91a and reduces the metal oxide film 91a. Accordingly, the metal oxide film 91a returns to a part of the metal film 91.

In the wet processing unit 10, the nozzle 12 discharges a wash solution such as a polymer wash solution as a processing solution.

An example of an operation of the substrate processing device 1 is also similar to that in FIG. 7. However, in Step S2, the dry processing unit 20 performs the hydrogen reduction processing as described above. Accordingly, the metal oxide film 91a returns to a part of the metal film 91.

Next, the transfer unit 30 transfers the substrate W from the dry processing unit 20 to the wet processing unit 10 (Step S3). Next, the wet processing unit 10 supplies a wash solution such as a polymer wash solution from the nozzle 12 to the upper surface of the substrate W to wash the substrate W (Step S4). The wet processing unit 10 supplies a rinse solution from the nozzle 12 to the upper surface of the substrate W after supplying the wash solution, and subsequently performs dry processing.

As described above, the substrate processing device 1 can perform the wash processing on the substrate W while suppressing the thickness reduction of the metal film 91.

When the surface of the metal film 91 is oxidized again after the hydrogen reduction processing, the metal oxide film is eluted in the wash processing. Thus, the wash processing is preferably started immediately after the hydrogen reduction processing. According to the substrate processing device 1, the transfer unit 30 can transfer the substrate W from the dry processing unit 20 to the wet processing unit 10 immediately after the hydrogen reduction processing. Thus, the wash processing on the substrate W can be started immediately after the hydrogen reduction processing. Furthermore, unnecessary thickness reduction in the metal film 91 can be appropriately suppressed. In other words, a deviation of the metal film 91 from a predetermined shape can be appropriately suppressed.

<Selective Etching on Different Types of Oxide Film>

There is a case where plural types of oxide film are formed on the upper surface of the substrate W by different methods of forming the films. For example, there is a case where a thermal oxide film formed by thermal oxidation and a CVD oxide film formed by CVD method are mixedly formed on the upper surface of the substrate W. The CVD oxide film may be doped with impurity. There is a case where the CVD oxide film is doped with boron to form a boron silicon glass (BSG) film as a specific example.

Figure 9:
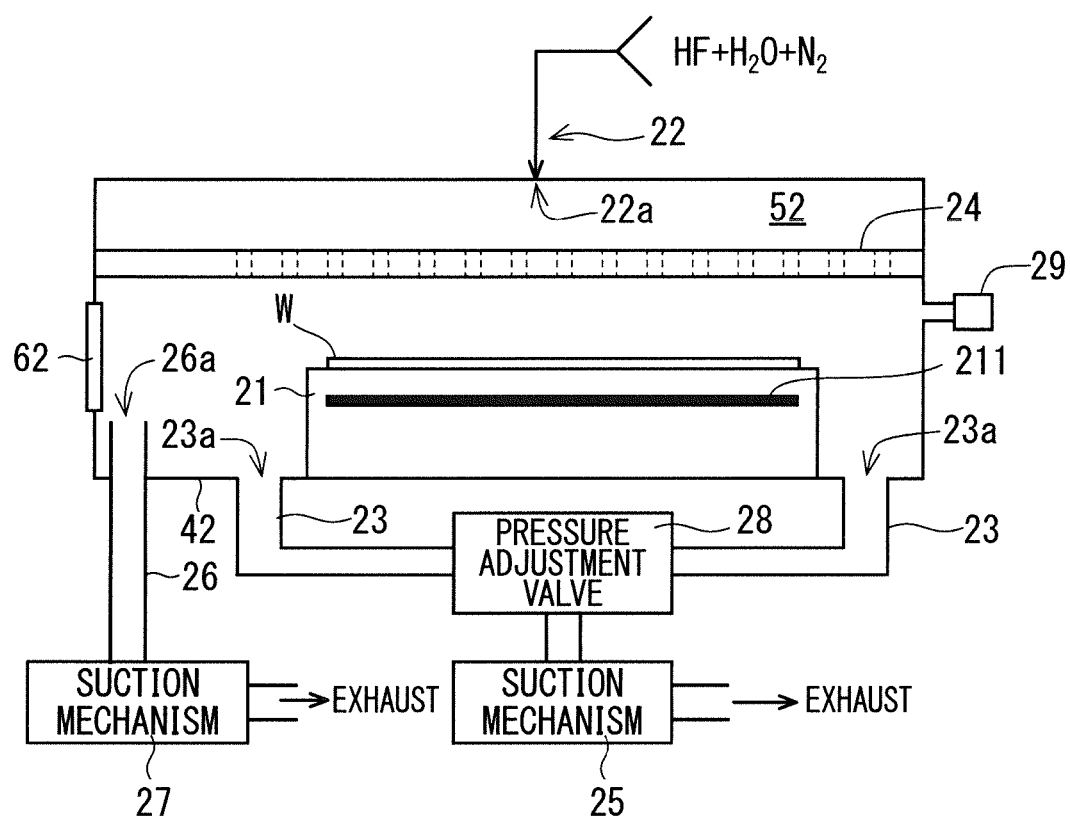
FIG. 9 is a drawing schematically illustrating an example of a configuration of a dry processing unit.

Adoptable as the dry processing is gas phase etching processing of selectively etching one of the thermal oxide film and the CVD oxide film (the BSG film herein) for the other one of the films. Herein, the CVD oxide film is etched for the thermal oxide film as an example. FIG. 9 is a drawing schematically illustrating an example of another configuration of the dry processing unit 20. The dry processing unit 20 also includes the substrate installation part 21, the temperature regulator 211, the gas supply part 22, and a dry suction tube 23 as with the case in FIG. 5.

The gas supply part 22 supplies hydrogen fluoride gas and moisture vapor as processing gas (etching gas) to the dry processing space 52. The gas supply part 22 may also supply inactive gas such as nitrogen as a carrier gas or pressure adjustment gas together with the etching gas.

In the example in FIG. 9, two dry suction tubes 23 are provided. The suction inlet 23a of the dry suction tube 23 is formed in the upper surface of the floor part 42, and is opened in the dry processing space 52. However, one dry suction tube 23 may be provided, and three or more dry suction tubes 23 may also be provided.

In the example in FIG. 9, a pressure adjustment valve 28 is provided in the dry suction tubes 23. The pressure adjustment valve 28 adjusts an opening degree in the dry suction tube 23, thereby adjusting the pressure in the dry processing space 52. The controller 200 controls the pressure adjustment valve 28.

In the example in FIG. 9, a pressure sensor 29 is also provided in the dry processing unit 20. The pressure sensor 29 detects a degree of vacuum in the dry processing space 52. The controller 200 controls the pressure adjustment valve 28, and adjusts the pressure in the dry processing space 52 so that the degree of vacuum detected by the pressure sensor 29 is within a regulated range.

When the substrate W is carried in the dry processing unit 20, vacuuming in the dry processing space 52 is started. The pressure adjustment valve 28 once reduces the pressure in the dry processing space 52 from several tens of Torr to several hundred Torr, and then adjusts the pressure to be 500 to 700 Torr. The pressure is once reduced to a smaller value, thus impurity in the dry processing space 52 can be exhausted with a high degree of accuracy and the dry processing space 52 can be cleaned.

The temperature regulator 211 adjusts the temperature of the substrate W within a range of 25 to 50° C., for example. This temperature range is appropriate for increasing an etching rate of the CVD oxide film to the thermal oxide film.

When the pressure and the temperature are adjusted, the gas supply part 22 supplies hydrogen fluoride gas, nitrogen gas, and moisture vapor to the dry processing space 52. When hydrogen fluoride gas and moisture vapor are supplied to the upper surface of the substrate W, hydrogen fluoride ion is generated by the reaction of hydrogen fluoride gas and water, and hydrogen fluoride ion contributes to the etching of the CVD oxide film of the substrate W.

Even after such gas phase etching processing, fluorine may remain on the upper surface of the substrate W, thus the wet processing for removing fluorine is preferably started immediately. According to the substrate processing device 1, the wet processing can be started immediately after the gas phase etching processing, thus the remaining fluorine can be immediately removed. Furthermore, the defect occurring in the substrate W can be suppressed more appropriately.

<Order of Dry Processing and Wet Processing>

In the operation example in FIG. 7, the wet processing is performed subsequently to the dry processing. That is to say, the wet processing is performed after the dry processing. However, the wet processing may be performed before the dry processing. That is to say, the dry processing may be performed subsequently to the wet processing for washing the substrate W. After the wet processing of washing the substrate W is performed, the upper surface of the substrate W may be contaminated again by particles, for example, as time passes, the dry processing is desired to be started immediately after the wet processing. According to the present substrate processing device 1, the transfer unit 30 can start the dry processing immediately after the wet processing.

<Pressure>

<Wet Suction Tube>

In the example in FIG. 4, the wet processing unit 10 further includes a wet suction tube 15. A suction inlet 15a of the wet suction tube 15 is opened in the wet processing space 51, and is located near the opening 44a of the inner wall 44. Herein, a positional relationship between the suction inlet 15a of the wet suction tube 15 and the opening 44a is firstly described using the suction inlet 14a of the wet suction tube 14. The suction inlet 15a of the wet suction tube 15 is provided in a position closer to the opening 44a in relation to both the suction inlets 14a in the horizontal direction, and is provided in a position closer to the opening 44a in relation to both the suction inlets 14a also in the vertical direction. That is to say, a distance from the suction inlet 15a to the opening 44a in the horizontal direction is smaller than a distance from each suction inlet 14a to the opening 44a in the horizontal direction, and a distance from the suction inlet 15a to the opening 44a in the vertical direction is smaller than a distance from each suction inlet 14a to the opening 44a in the vertical direction.

Figure 10:
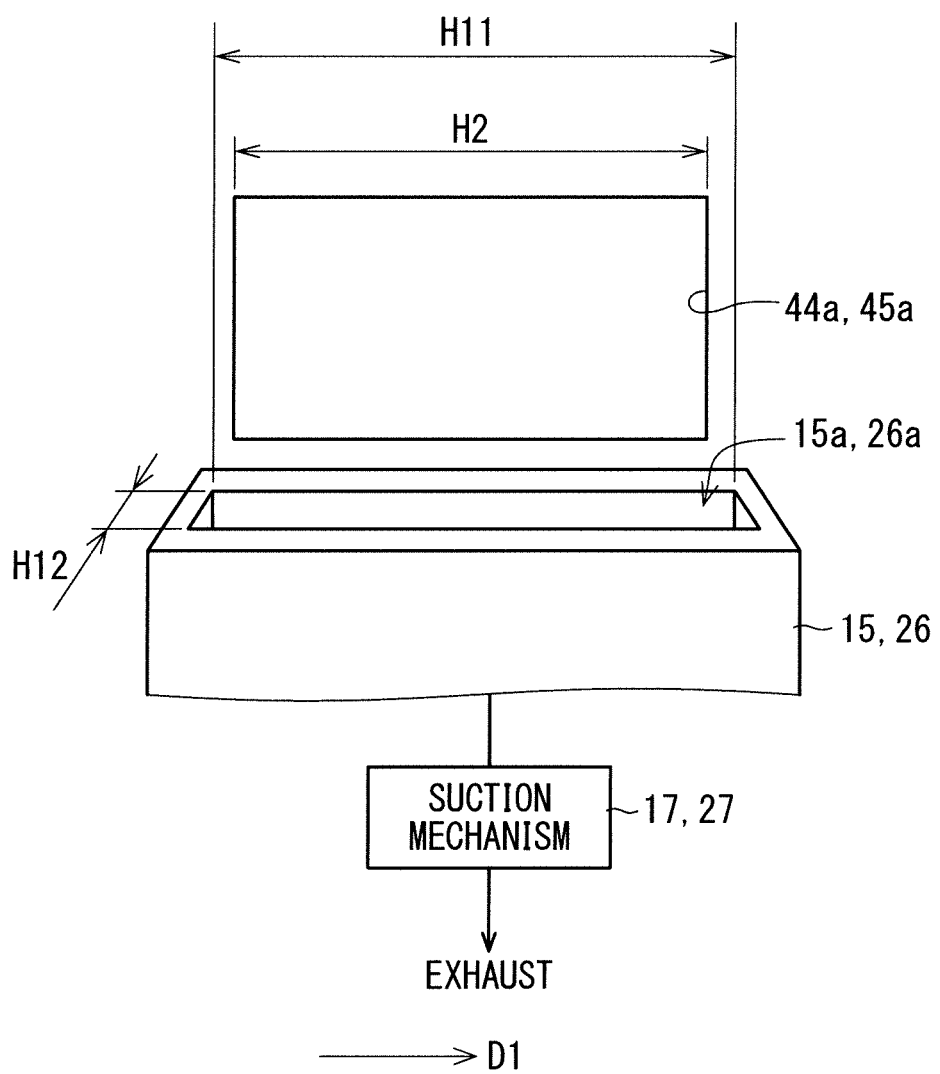
FIG. 10 is a perspective view schematically illustrating an example of a configuration of a wet suction tube and a dry suction tube.

FIG. 10 is a perspective view schematically illustrating an example of a configuration of the wet suction tube 15. The opening 44a is also illustrated in FIG. 9. In the example in FIG. 10, the opening 44a has a rectangular shape, and is formed so that one side thereof follows the vertical direction.

The wet suction tube 15 is located on an outer side in relation to the opening 44a in a side view along the direction D2. Accordingly, a collision of the wet suction tube 15 against the transfer unit 30 and the substrate W can be prevented when the transfer unit 30 carries in and out the substrate W. In the example in FIG. 10, the suction inlet 15a of the wet suction tube 15 is located on a vertically lower side in relation to the opening 44a, and the wet suction tube 15 extends on the vertically lower side from the suction inlet 15a.

The wet suction tube 15 is connected to a suction mechanism 17 outside the wet processing space 51. The suction mechanism 17 includes a pump, for example, and sucks the atmosphere gas in the wet suction tube 15. The controller 200 controls the suction mechanism 17. A dedicated suction mechanism for the substrate processing device 1 (a pump, for example) may be adopted as the suction mechanism 17, or factory utility facilities which can also be used for the other device may also be adopted. The gas near the opening 44a is sucked in the suction inlet 15a by the suction operation of the suction mechanism 17, and exhausted outside through the wet suction tube 15.

In the example in FIG. 4, the suction mechanism 16 is provided to correspond to the wet suction tube 14, and the suction mechanism 17 is provided to correspond to the wet suction tube 15, however, a suction mechanism to which the wet suction tube 14 and the wet suction tube 15 are connected in common may also be provided.

When the hand of the transfer unit 30 passes through the opening 44a, the atmosphere gas around the hand moves in the same direction as a movement direction of the hand in accordance with the movement of the hand. For example, when the transfer unit 30 moves the hand from the wet processing space 51 toward the transfer space 53, the atmosphere gas in the wet processing space 51 may move to a side of the transfer space 53 in accordance with the movement of the hand. Thus, when the hand passes through the opening 44a, a small amount of atmosphere gas in the wet processing space 51 may flow to the transfer space 53 in accordance with the passing of the hand.

In contrast, in the example in FIG. 4, the suction inlet 15a of the wet suction tube 15 is located near the opening 44a in the wet processing space 51. Thus, the atmosphere gas near the opening 44a can be sucked in the wet processing space 51. Accordingly, the flowing of the atmosphere gas from the wet processing space 51 to the transfer space 53 at the time when the hand passes through the opening 44a can be further suppressed.

It is sufficient that the suction operation of the wet suction tube 15 is performed in at least a part of a period during which the shutter 61 opens. For example, the suction mechanism 17 may start the suction operation before the shutter 61 starts opening and finish the suction operation after the shutter 61 finishes closing. Conversely, the suction mechanism 17 needs not perform the suction operation in at least a part of a period during which the shutter 61 closes. Accordingly, a consumed power of the suction mechanism 17 can be reduced while suppressing the flowing of the atmosphere gas in the wet processing space 51 at the time of transferring the substrate W.

In the example in FIG. 4, the wet suction tube 15 is located on a vertically lower side in relation to a lower end of the opening 44a, and the suction inlet 15a opens toward the vertically upper side. That is to say, the suction inlet 15a is opened toward the opening 44a in a side view along the direction D2. Accordingly, the atmosphere gas near the opening 44a can be sucked easily. Thus, the flowing of the atmosphere gas from the wet processing space 51 to the transfer space 53 can be further suppressed.

In the example in FIG. 10, a width H11 of the suction inlet 15a of the wet suction tube 15 is larger than a width H2 of the opening 44a. The width H2 of the opening 44a herein is a width perpendicular to a direction in which the hand of the transfer unit 30 passes through the opening 44a (the direction D2 herein) and following the horizontal direction (the arrangement direction D1 herein). The width H11 of the suction inlet 15a is a width along the same direction as that of the width H2.

In the example in the drawing, the width H11 of the suction inlet 15a is a fixed-width, however, there may also be a case where the width H11 differs in each position in the direction D2. In the similar manner, there may be a case where the width H2 of the opening 44a also differs in each position in the vertical direction. In this case, at least a maximum value of the width H11 of the suction inlet 15a is set larger than a minimum value of the width H2 of the opening 45a, and more preferably, a minimum value of the width H11 is set larger than a maximum value of the width H2.

Accordingly, the whole atmosphere gas which is to pass through the opening 44a can be effectively flowed in the suction inlet 15a. Thus, the flowing of the atmosphere gas from the wet processing space 51 to the transfer space 53 can be further suppressed.

In the example in FIG. 10, the wet suction tube 15 has a flat cylindrical shape, and the suction inlet 15a has an elongated shape. Herein, the width H12 of the suction inlet 15a is introduced. The width H12 is a width along the direction D2 perpendicular to the arrangement direction D1. The elongated shape herein indicates a shape in which the width H11 is larger than the width H12. In the example in FIG. 10, the suction inlet 15a has a rectangular shape. When the suction inlet 15a has an elongated shape elongated in the arrangement direction D1, an area of the suction inlet 15a can be reduced while securing the width H11. Accordingly, a suction speed of the atmosphere gas near the suction inlet 15a can be increased, and the atmosphere gas in the wet processing space 51 can be sucked more strongly. Thus, the flowing of the gas from the wet processing space 51 to the transfer space 53 can be further suppressed.

<Dry Suction Tube>

In the example in FIG. 5, the dry processing unit 20 further includes a dry suction tube 26. A suction inlet 26a of the dry suction tube 26 is opened in the dry processing space 52, and is located near the opening 45a of the inner wall 45. Herein, a positional relationship between the suction inlet 26a of the dry suction tube 26 and the opening 45a is firstly described using the suction inlet 23a of the dry suction tube 23. The suction inlet 26a of the dry suction tube 26 is provided in a position closer to the opening 45a in relation to the suction inlet 23a in the horizontal direction, and is provided in a position closer to the opening 45a in relation to the suction inlet 23a also in the vertical direction. That is to say, a distance from the suction inlet 26a to the opening 45a in the horizontal direction is smaller than a distance from the suction inlet 23a to the opening 45a in the horizontal direction, and a distance from the suction inlet 23a to the opening 45a in the vertical direction is smaller than a distance from the suction inlet 23a to the opening 45a in the vertical direction.

A relationship between the dry suction tube 26 and the opening 45a is similar to that between the wet suction tube 15 and the opening 44a in FIG. 10. A shape of the dry suction tube 26 is also similar to that of the wet suction tube 15. Thus, a repetitive description is omitted herein.

The dry suction tube 26 is connected to a suction mechanism 27 outside the dry processing space 52. The suction mechanism 27 includes a pump, for example, and sucks atmosphere gas in the dry suction tube 26. The controller 200 controls the suction mechanism 27. A dedicated suction mechanism for the substrate processing device 1 (a pump, for example) may be adopted as the suction mechanism 27, or factory utility facilities which can also be used for the other device may also be adopted. The atmosphere gas near the opening 45a is sucked in the suction inlet 26a by the suction operation of the suction mechanism 27, and exhausted outside through the dry suction tube 26.

In the example in FIG. 5, the suction mechanism 25 is provided to correspond to the dry suction tube 23, and the suction mechanism 27 is provided to correspond to the dry suction tube 26, however, a suction mechanism to which the dry suction tube 23 and the dry suction tube 26 are connected in common may also be provided.

The atmosphere gas near the opening 45a can be sucked in the dry processing space 52 by the suction operation of the suction mechanism 27. Accordingly, when the hand of the transfer unit 30 passes through the opening 45a from the dry processing space 52 to the transfer space 53, the flowing of the atmosphere gas from the dry processing space 52 to the transfer space 53 can be further suppressed. In the example in the drawing, the suction inlet 26a of the dry suction tube 26 has a shape similar to that of the suction inlet 15a of the wet suction tube 15, thus the flowing of the atmosphere gas from the dry processing space 52 to the transfer space 53 can be further suppressed.

<Gas Exhaust of Transfer Space 53>

As described above, the transfer unit 30 which is a drive mechanism is housed in the transfer space 53. Particles may occur when the transfer unit 30 is activated. When the particles adhere to the substrate W, a product failure may be caused. Thus, the atmosphere gas in the transfer space 53 may be exhausted to remove the particles in the transfer space 53.

Figure 11:
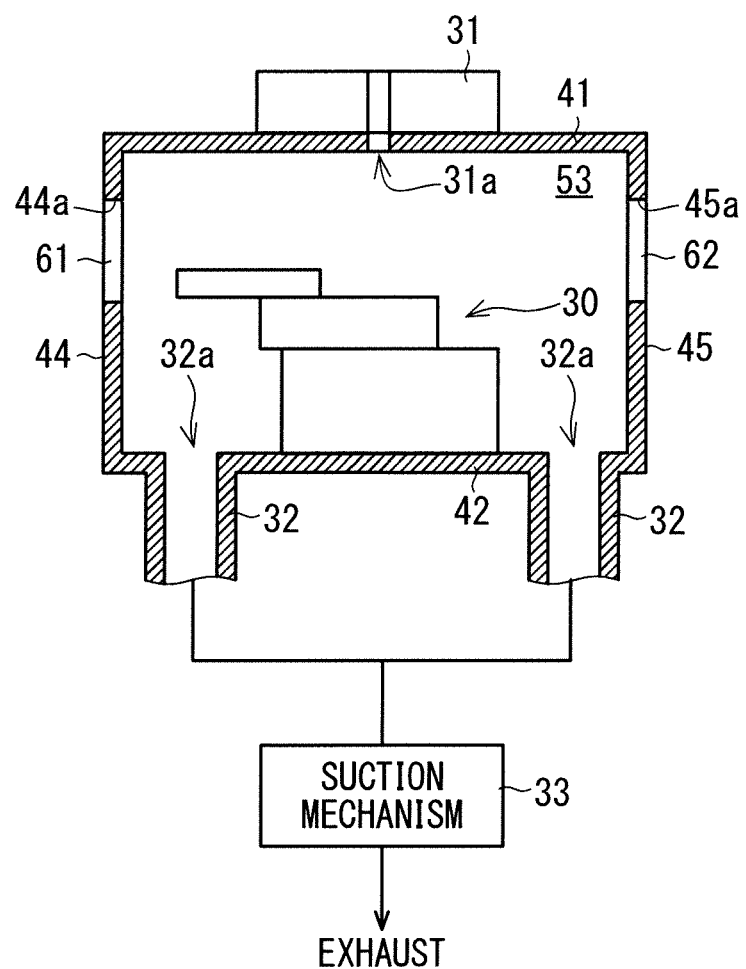
FIG. 11 is a drawing schematically illustrating another example of a configuration of the transfer unit.

FIG. 11 is a drawing schematically illustrating an example of the transfer unit 30. In the example in FIG. 11, a transfer suction tube 32 exhausting the atmosphere gas in the transfer space 53 is provided. A suction inlet 32a of the transfer suction tube 32 is opened in the transfer space 53. As a specific example, the suction inlet 32a of the transfer suction tube 32 is formed in an upper surface of the floor part 42 of the chassis 40, and is opened to the transfer space 53.

The transfer suction tube 32 is connected to a suction mechanism 33. The suction mechanism 33 includes a pump, for example, and sucks atmosphere gas in the transfer suction tube 32. The controller 200 controls the suction mechanism 33. The atmosphere gas in the transfer space 53 is sucked in the suction inlet 32a by the suction operation of the suction mechanism 33, and exhausted outside through the transfer suction tube 32. A dedicated pump for the substrate processing device 1 may be adopted as the suction mechanism 33, or factory utility facilities which can also be used for the other device may also be adopted.

In the example in FIG. 11, two transfer suction tubes 32 are provided. The suction inlet 32a of one transfer suction tube 32 is formed on an opposite side of the transfer unit 30 from the suction inlet 32a of the other transfer suction tube 32 in a plan view. One transfer suction tube 32 may be provided, or three or more transfer suction tubes 32 may also be provided.

The suction mechanism 33 performs the suction operation in a state where the transfer unit 30 does not hold the substrate W and the shutters 61 and 62 are closed. Accordingly, the atmosphere gas in the transfer space 53 is exhausted outside in a state where the substrate W is not located in the transfer space 53, and pressure in the transfer space 53 decreases. The suction mechanism 33 sucks the atmosphere gas in the transfer space 53 until the pressure in the transfer space 53 is reduced to have a threshold value or less which is smaller than that of the pressure in the wet processing space 51 and the dry processing space 52. It is sufficient that the threshold value is appropriately set.

The particles occurring in the transfer space 53 caused by activating the transfer unit 30 can be exhausted outside by such decompression processing. Accordingly, a possibility of adhesion of the particles to the substrate W can be reduced.

After the particles are exhausted outside, the suction mechanism 33 finishes the suction operation. The pressure in the transfer space 53 is adjusted to have a slightly larger value than that of the atmospheric pressure again by supplying the inactive gas by the gas supply part 31. Accordingly, the pressure in the transfer space 53 is increased to be larger than both the pressure in the wet processing unit 10 and the pressure in the dry processing unit 20. The transfer unit 30 transfers the substrate W in this state. That is to say, the substrate W does not pass through the decompression space at the time of transferring the substrate W.

<Connection of Processing Modules>

The chassis 40 of the two processing modules 100 adjacent to each other may be detachably connected to each other. With reference to FIG. 2, the ceiling part 41 of the chassis 40 may be detachably connected to the floor part 42 of the chassis 40 located on an upper stage, for example. Alternatively, with reference to FIG. 3, the sidewalls 43 of the chassis 40 adjacent to each other in the direction D2 may be detachably connected to each other. Various configurations can be adopted as a connection member detachably connecting the chassis 40, and a screwing structure can be adopted, for example.

When the chassis 40 are detachably connected to each other, a configuration of the processing module 100 in the substrate processing device 1 can be easily changed. For example, a certain processing module 100 can be replaced easily. The processing module 100 can be additionally provided or reduced in number easily.

Although the substrate processing device 1 was described in detail above, the above description is in all aspects exemplary, and the substrate processing device 1 is not limited thereto. It is understood that countless variations that have not been described as examples can be envisioned without departing from the scope of the invention. Each structure described in each embodiment and each variation can be appropriately combined or omitted unless any contradiction occurs.

For example, plasma processing using atmospheric-pressure plasma may be adopted as the dry processing. In this case, the dry processing unit 20 includes an electrode for generating the atmospheric-pressure plasma and a voltage apply circuit applying voltage to the electrode. The plurality of wet processing units 10 may perform the same type of wet processing, or at least one wet processing unit 10 may perform a different type of wet processing from the other wet processing unit 10. The same applies to the dry processing unit 20.

What is claimed is:

1. A substrate processing device continuously performing wet processing and dry processing on a substrate, comprising
 a transportation robot provided in a transportation space; and
 a plurality of processing modules adjacent to the transportation space, wherein
 each of the plurality of processing modules includes:

a single wet processing unit including a substrate holder holding a substrate and a nozzle discharging a processing solution to a substrate held by the substrate holder, and performing wet processing on a substrate;

a single dry processing unit including a gas supply part having a substrate installation part with a substrate installation surface on which a substrate is disposed and a supply port supplying gas to a substrate, and performing dry processing on a substrate;

a single transfer unit located between the wet processing unit and the dry processing unit and including a hand and a hand driver moving the hand to transfer a substrate between the wet processing unit and the dry processing unit;

a chassis housing the wet processing unit, the dry processing unit, and the transfer unit, wherein the chassis includes a ceiling part, a floor part, a sidewall, a first inner wall, and a second inner wall, the first inner wall partitions an inner space of the chassis into a wet processing space including the wet processing unit and a transfer space including the transfer unit, the second inner wall partitions the inner space of the chassis into the transfer space and a dry processing space including the dry processing unit, the sidewall partitioning the inner space of the chassis and the transportation space includes a first shutter adjacent to the wet processing space and a second shutter adjacent to the dry processing space, and the transportation robot is configured to receive and deliver the substrate with the wet processing unit of each of the plurality of processing modules via a first opening of the sidewall formed while the first shutter is opened, and to receive and deliver the substrate with the dry processing unit of each of the plurality of processing modules via a second opening of the sidewall formed while the second shutter is opened.

2. The substrate processing device according to claim 1, wherein the dry processing includes at least one of oxidation processing or resist removal processing using ozone gas, gas phase etching processing using etching gas containing fluorine, and hydrogen reduction processing using hydrogen gas, and the wet processing includes wash processing of washing a substrate.

3. The substrate processing device according to claim 1, wherein the first inner wall includes a third shutter for transferring a substrate; and the second inner wall includes a fourth shutter for transferring a substrate.

4. The substrate processing device according to claim 3, wherein the wet processing unit includes a wet suction tube provided in the wet processing space to suck gas in the wet processing space, and a suction inlet of the wet suction tube is located near a third opening formed in the first inner wall when the third shutter is opened.

5. The substrate processing device according to claim 4, wherein a width of the suction inlet of the wet suction tube is larger than a width of the third opening.

6. The substrate processing device according to claim 3, wherein the dry processing unit includes a dry suction tube provided in the dry processing space to suck gas in the dry processing space, and a suction inlet of the dry suction tube is located near a fourth opening formed in the second inner wall when the fourth shutter is opened.

7. The substrate processing device according to claim 6, wherein a width of the suction inlet of the dry suction tube is larger than a width of the fourth opening.

8. The substrate processing device according to claim 3, wherein pressure in the transfer space is larger than both pressure in the wet processing space and pressure in the dry processing space.

9. The substrate processing device according to claim 3, wherein each of the plurality of processing modules further includes a gas supply part supplying inactive gas to the transfer space.

10. The substrate processing device according to claim 3, wherein each of the plurality of processing modules further includes a transfer suction tube sucking gas in the transfer space.

11. The substrate processing device according to claim 1, wherein the substrate is transferred between the dry processing unit and the wet processing unit without passing through a decompression space.

* * * * *